(12) United States Patent
Holland et al.

(10) Patent No.: US 11,581,424 B2
(45) Date of Patent: Feb. 14, 2023

(54) METHOD OF MANUFACTURING FINFETS HAVING BARRIER LAYERS WITH SPECIFIED SIGE DOPING CONCENTRATION

(71) Applicant: TAIWAN SEMICONDUCTOR MANUFACTURING CO., LTD., Hsinchu (TW)

(72) Inventors: Martin Christopher Holland, Bertem (BE); Marcus Johannes Henricus Van Dal, Linden (BE)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 155 days.

(21) Appl. No.: 16/370,722

(22) Filed: Mar. 29, 2019

(65) Prior Publication Data
US 2020/0098894 A1 Mar. 26, 2020

Related U.S. Application Data

(60) Provisional application No. 62/736,708, filed on Sep. 26, 2018.

(51) Int. Cl.
*H01L 29/08* (2006.01)
*H01L 29/165* (2006.01)
(Continued)

(52) U.S. Cl.
CPC .... *H01L 29/66795* (2013.01); *H01L 21/0217* (2013.01); *H01L 21/02164* (2013.01);
(Continued)

(58) Field of Classification Search
CPC .......... H01L 21/02532; H01L 27/0886; H01L 27/10826; H01L 27/10879; H01L 29/0847;
(Continued)

(56) References Cited

U.S. PATENT DOCUMENTS 8,962,400 B2  2/2015  Tsai et al.
9,093,514 B2  7/2015  Tsai et al.
(Continued)

FOREIGN PATENT DOCUMENTS

| KR | 10-2018-0018500 A | 2/2018 |
| TW | 201804524 A | 2/2018 |
| WO | 2016204782 A1 | 12/2016 |

OTHER PUBLICATIONS

N. R. Zangenberg et al., "Boron and phosphorus diffusion in strained and relaxed Si and SiGe," Journal of Applied Physics 94, 3883 (2003).

*Primary Examiner* — Herve-Louis Y Assouman
*Assistant Examiner* — Christopher M Roland
(74) *Attorney, Agent, or Firm* — McDermott Will & Emery LLP

(57) ABSTRACT

In a method of manufacturing a semiconductor device, a gate structure is formed over a fin structure. A source/drain region of the fin structure is recessed. A first semiconductor layer is formed over the recessed source/drain region. A second semiconductor layer is formed over the first semiconductor layer. The fin structure is made of $Si_xGe_{1-x}$, where $0 \leq x \leq 0.3$, the first semiconductor layer is made of $Si_yGe_{1-y}$, where $0.45 \leq y \leq 1.0$, and the second semiconductor layer is made of $Si_zGe_{1-z}$, where $0 \leq z \leq 0.3$.

20 Claims, 31 Drawing Sheets

(51) Int. Cl.
  *H01L 29/167* (2006.01)
  *H01L 29/78* (2006.01)
  *H01L 21/311* (2006.01)
  *H01L 21/306* (2006.01)
  *H01L 29/66* (2006.01)
  *H01L 29/06* (2006.01)
  *H01L 21/02* (2006.01)
  *H01L 29/36* (2006.01)
  *H01L 29/423* (2006.01)

(52) U.S. Cl.
  CPC .. *H01L 21/02271* (2013.01); *H01L 21/02532* (2013.01); *H01L 21/30604* (2013.01); *H01L 21/31111* (2013.01); *H01L 29/0673* (2013.01); *H01L 29/0847* (2013.01); *H01L 29/165* (2013.01); *H01L 29/167* (2013.01); *H01L 29/36* (2013.01); *H01L 29/42392* (2013.01); *H01L 29/6656* (2013.01); *H01L 29/66545* (2013.01); *H01L 29/66636* (2013.01); *H01L 29/785* (2013.01); *H01L 29/7851* (2013.01)

(58) Field of Classification Search
  CPC ..... H01L 29/165; H01L 29/167; H01L 29/36; H01L 29/41791; H01L 29/42392; H01L 29/66545; H01L 29/66636; H01L 29/66795; H01L 29/785; H01L 29/7851
  See application file for complete search history.

(56) References Cited

U.S. PATENT DOCUMENTS

| | | | |
|---|---|---|---|
| 9,236,267 | B2 | 1/2016 | De et al. |
| 9,245,805 | B2 | 1/2016 | Yeh et al. |
| 9,343,300 | B1 | 5/2016 | Jacob et al. |
| 9,418,897 | B1 | 8/2016 | Ching et al. |
| 9,520,482 | B1 | 12/2016 | Chang et al. |
| 9,576,814 | B2 | 2/2017 | Wu et al. |
| 9,608,116 | B2 | 3/2017 | Ching et al. |
| 9,812,363 | B1 | 11/2017 | Liao et al. |
| 9,859,380 | B2 | 1/2018 | Lee et al. |
| 9,911,849 | B2 | 3/2018 | Basker et al. |
| 2004/0014276 | A1 | 1/2004 | Murthy et al. |
| 2006/0237746 | A1 | 10/2006 | Orlowski et al. |
| 2014/0008700 | A1* | 1/2014 | Rachmady ........ H01L 29/78684 257/192 |
| 2014/0070316 | A1* | 3/2014 | Chan ............... H01L 21/823412 257/347 |
| 2016/0027877 | A1 | 1/2016 | Lee et al. |
| 2016/0027918 | A1* | 1/2016 | Kim ..................... H01L 29/165 257/401 |
| 2016/0254364 | A1* | 9/2016 | Kwok ............... H01L 29/66636 438/285 |
| 2016/0343815 | A1 | 11/2016 | Wang et al. |
| 2017/0154990 | A1* | 6/2017 | Sung ..................... H01L 29/785 |
| 2018/0033630 | A1 | 2/2018 | Huang et al. |
| 2018/0190653 | A1 | 7/2018 | Lu et al. |
| 2018/0337234 | A1* | 11/2018 | Zhao .................... H01L 29/0847 |
| 2019/0165175 | A1* | 5/2019 | More ............. H01L 21/823431 |
| 2019/0280123 | A1* | 9/2019 | Lee .................... H01L 29/66651 |
| 2021/0313419 | A1* | 10/2021 | Lee ..................... H01L 29/4925 |

* cited by examiner

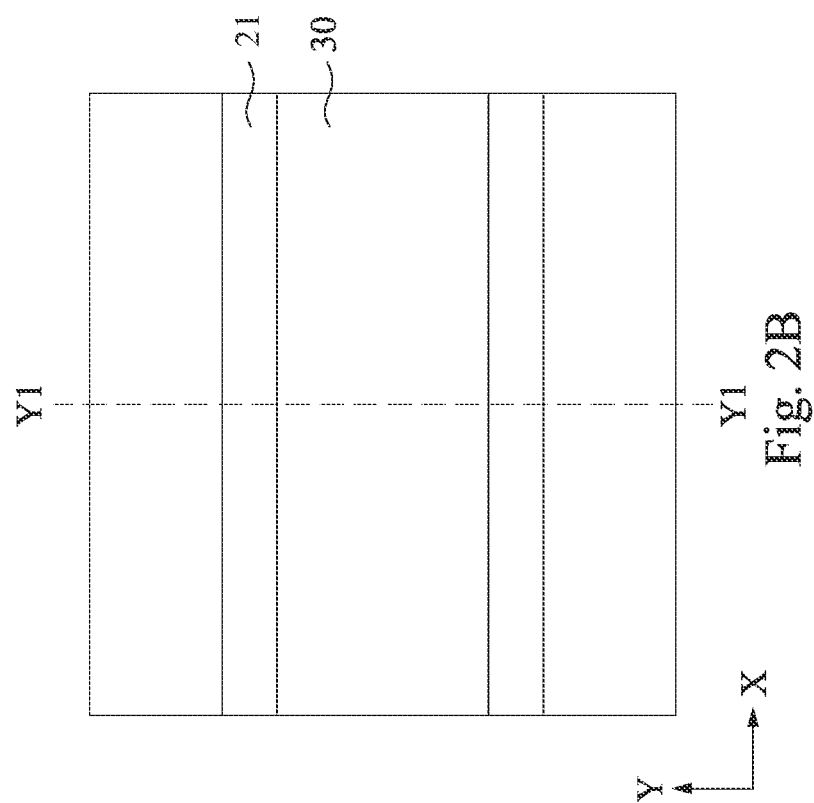
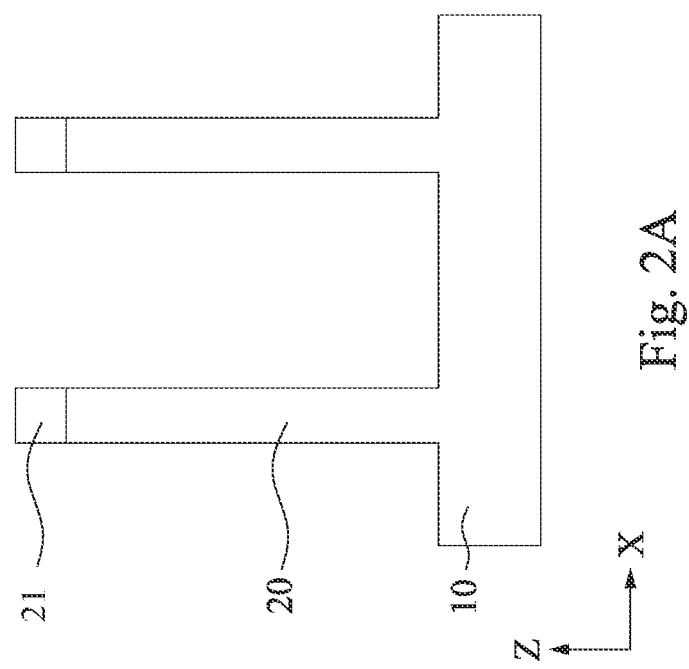

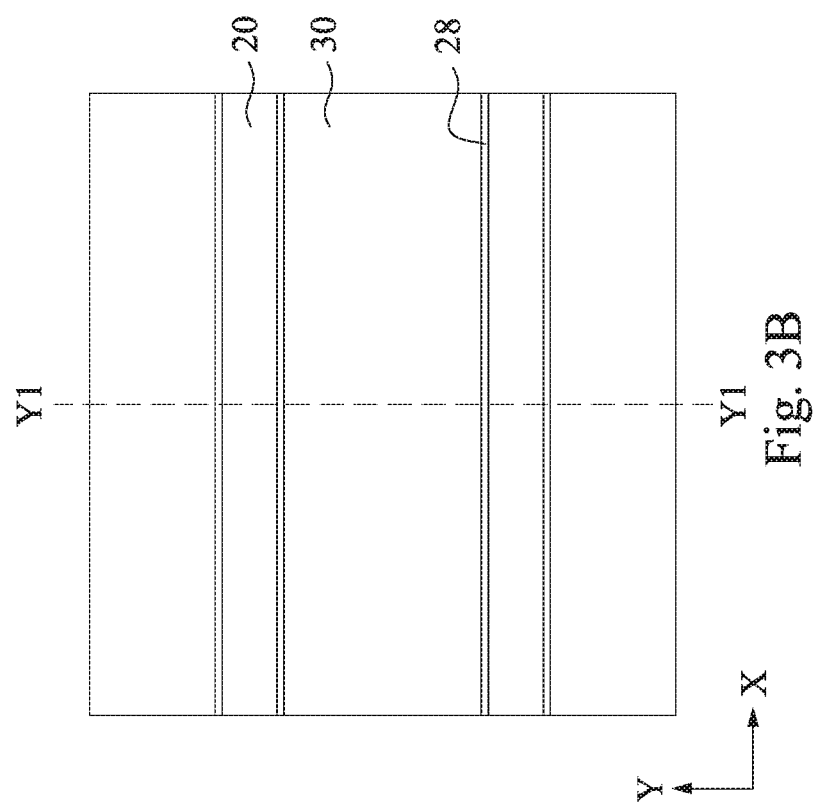
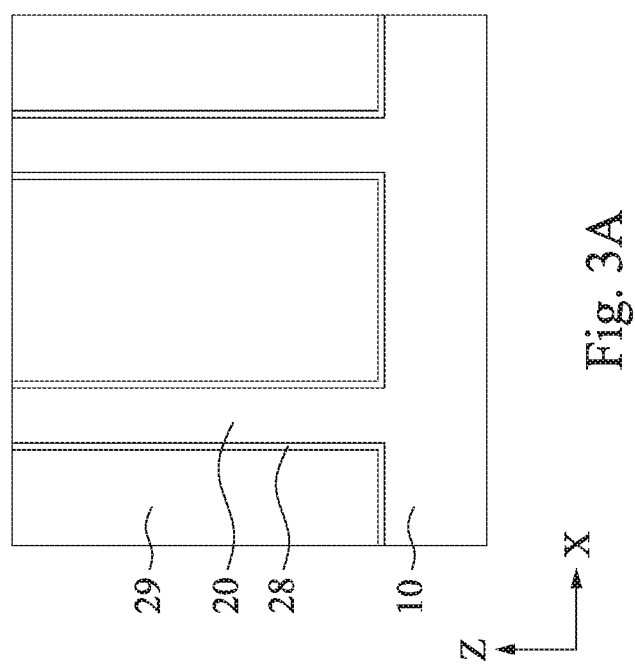

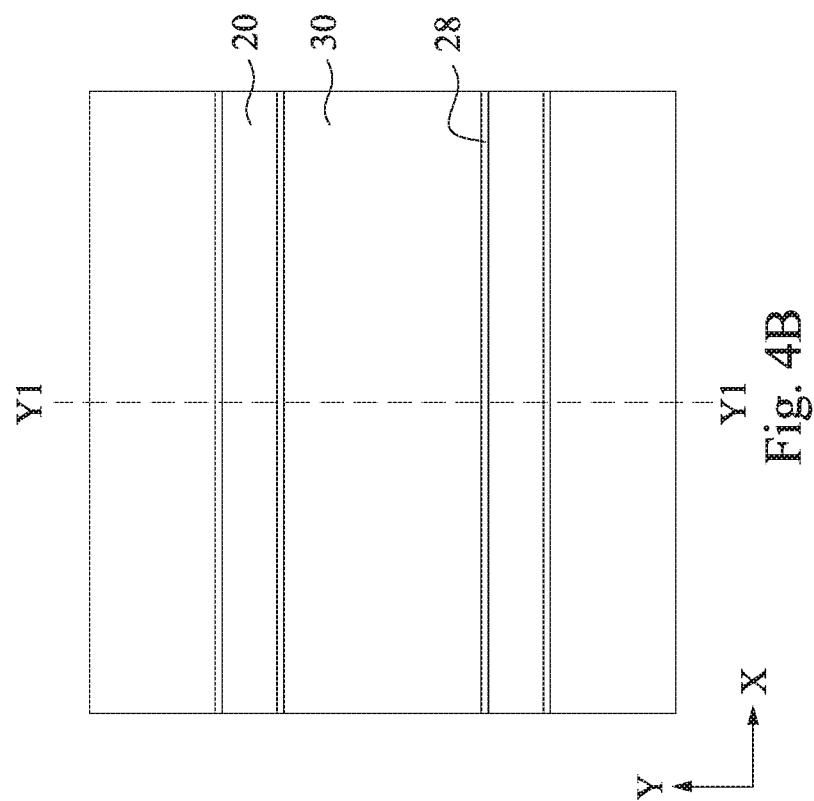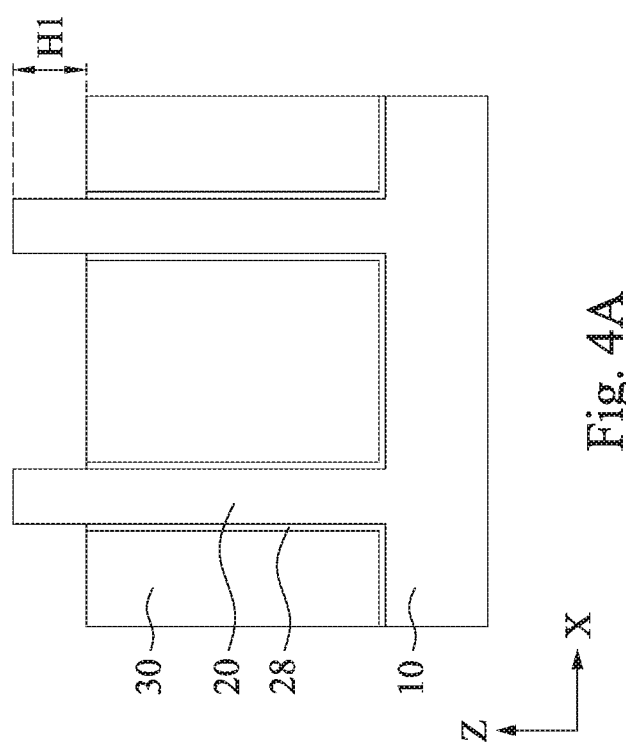

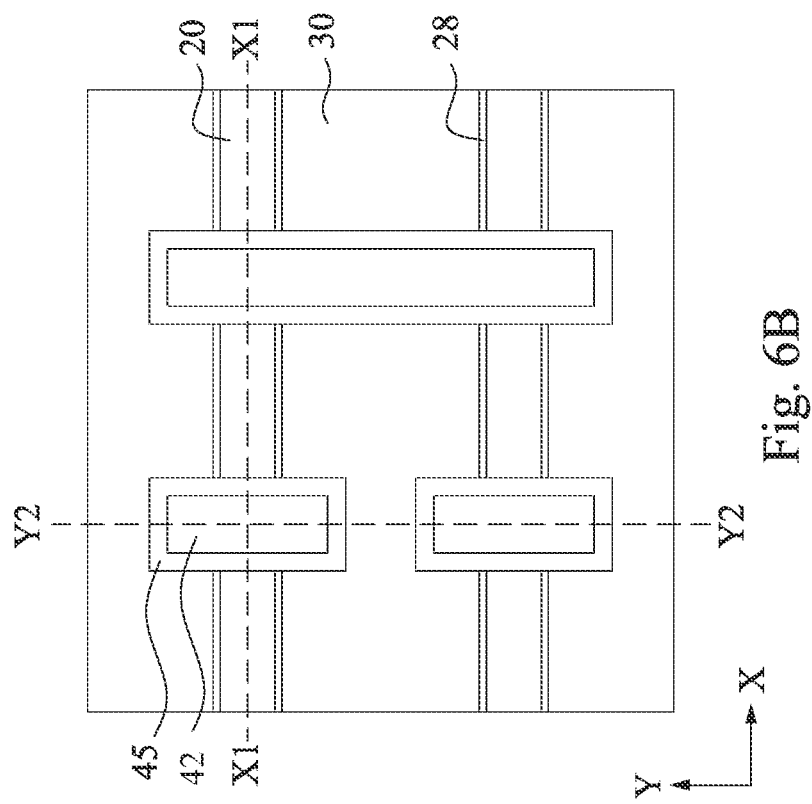
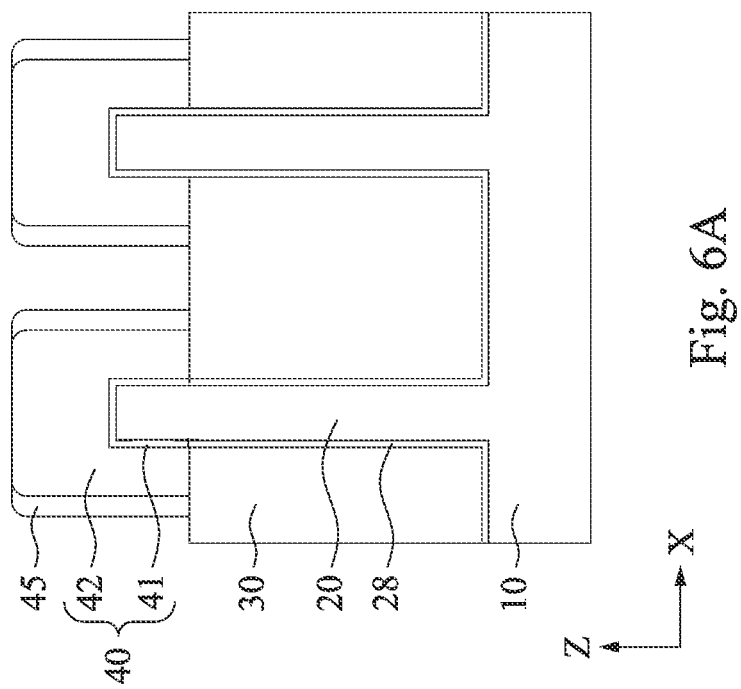
Fig. 6A
Fig. 6B

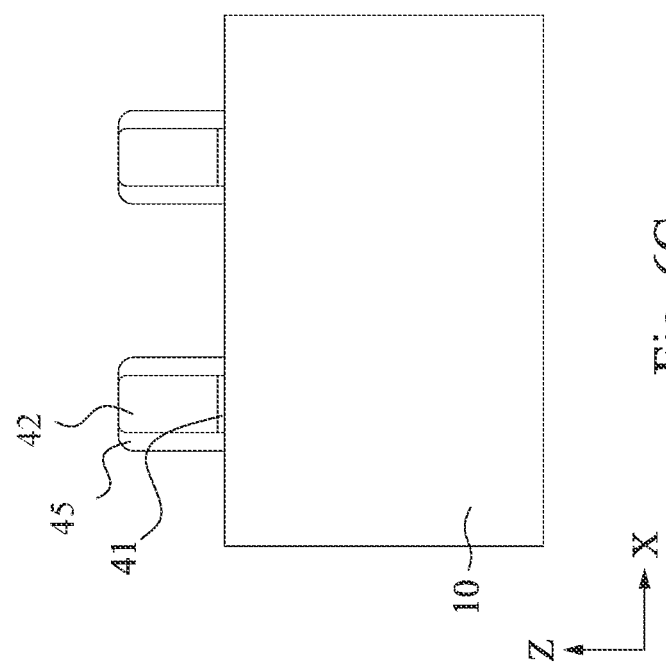

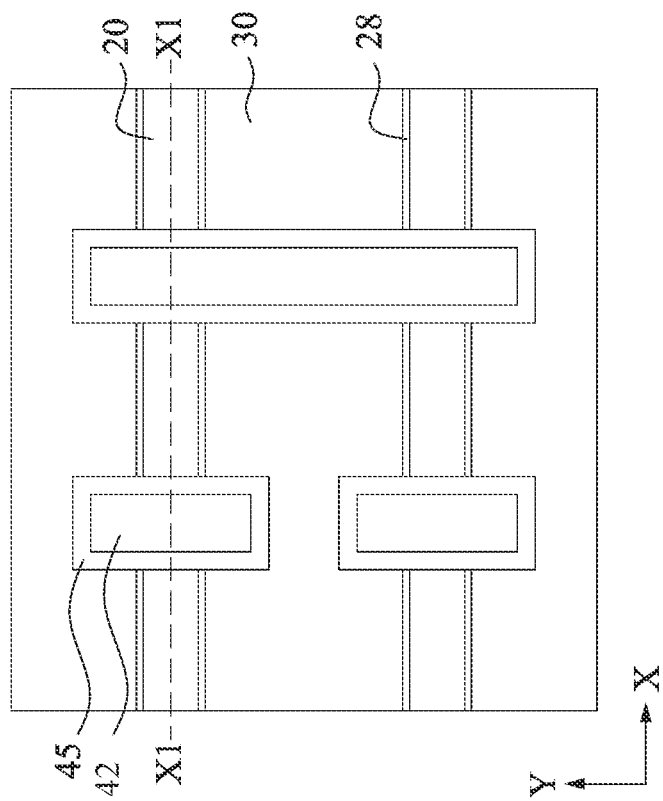
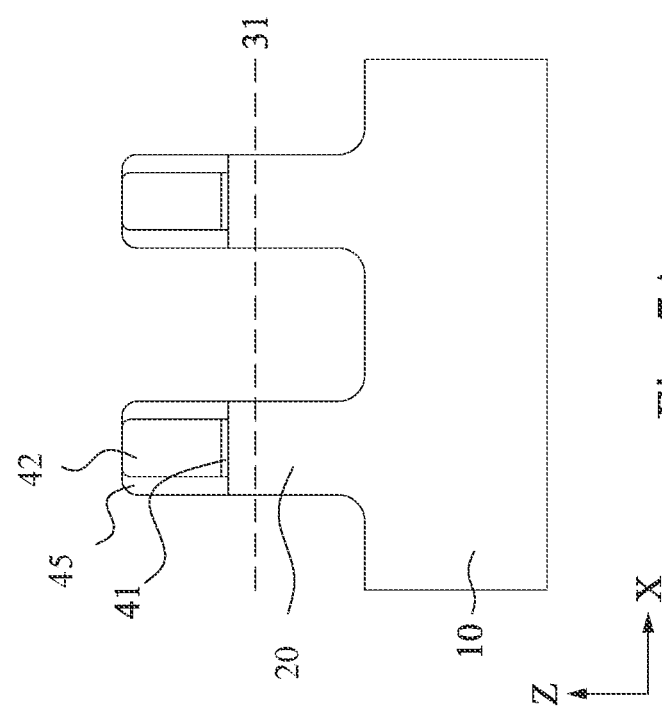
Fig. 7B
Fig. 7A

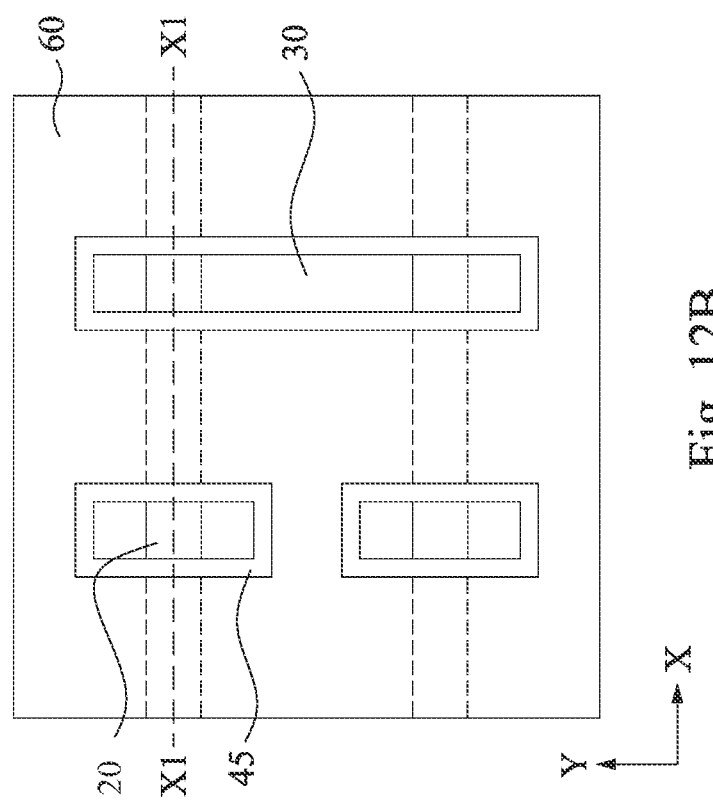
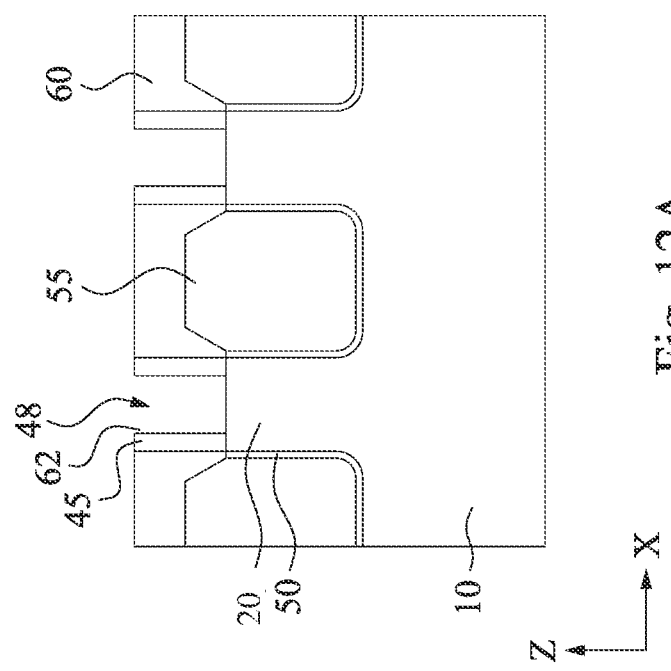
Fig. 12B
Fig. 12A

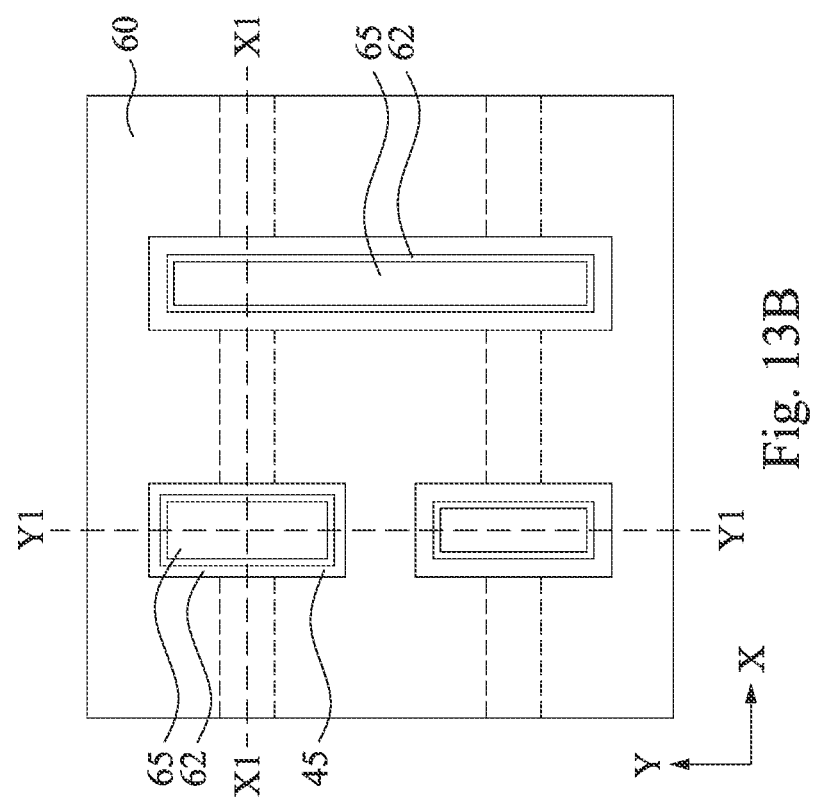
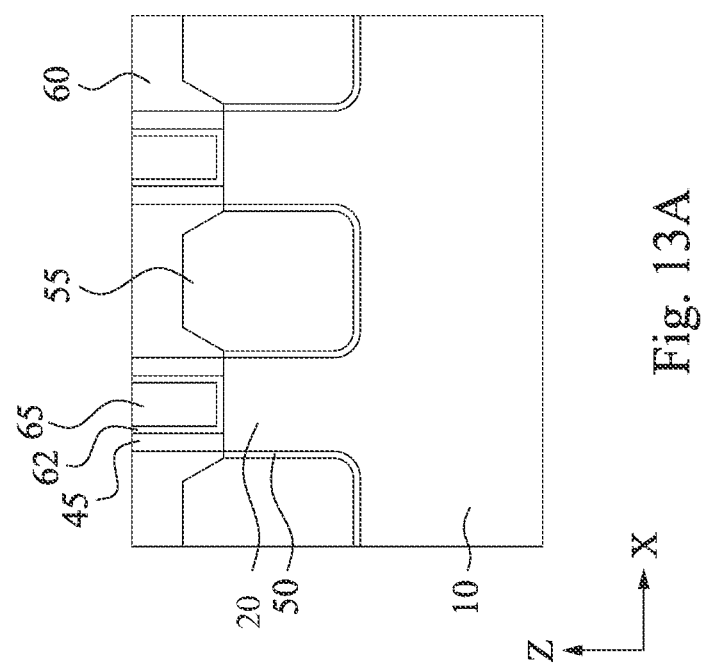
Fig. 13A
Fig. 13B

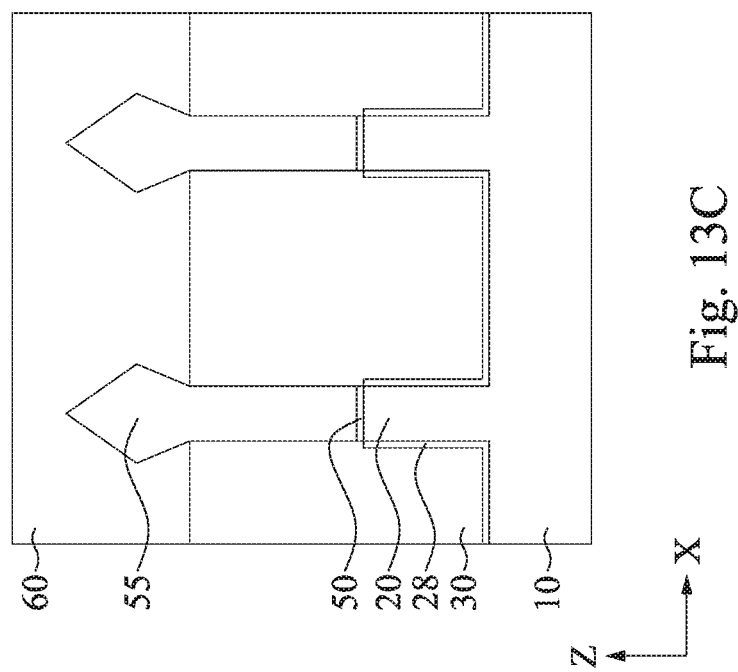

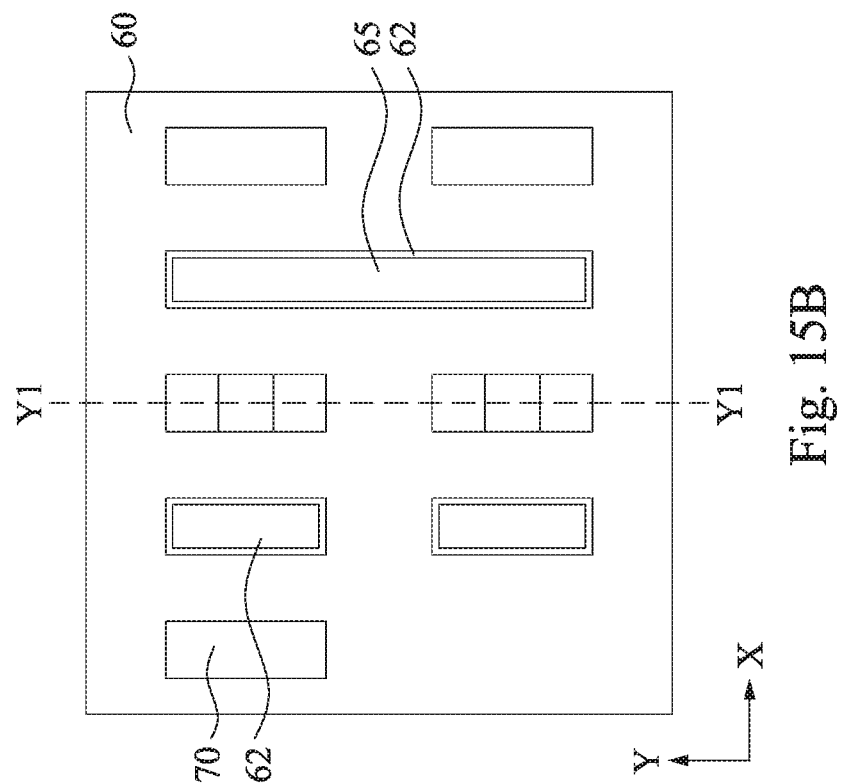
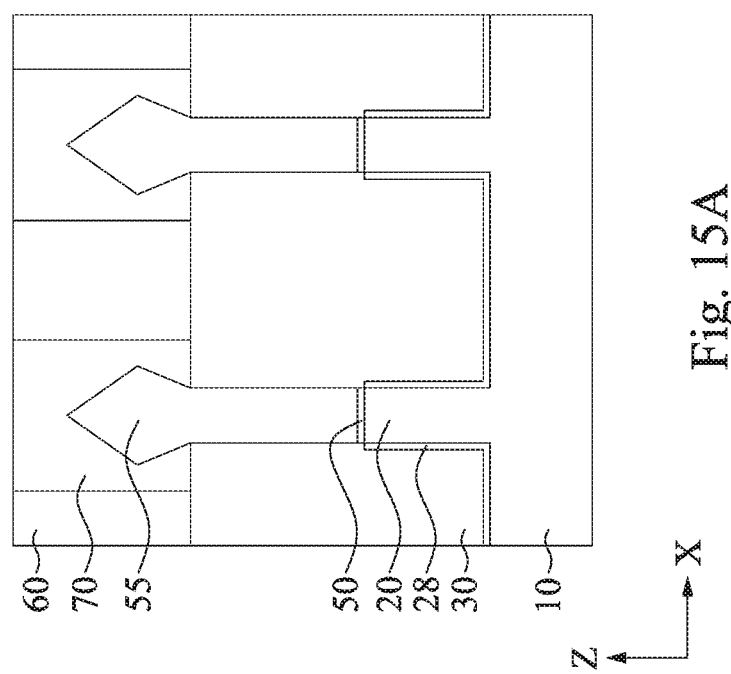
Fig. 15B
Fig. 15A

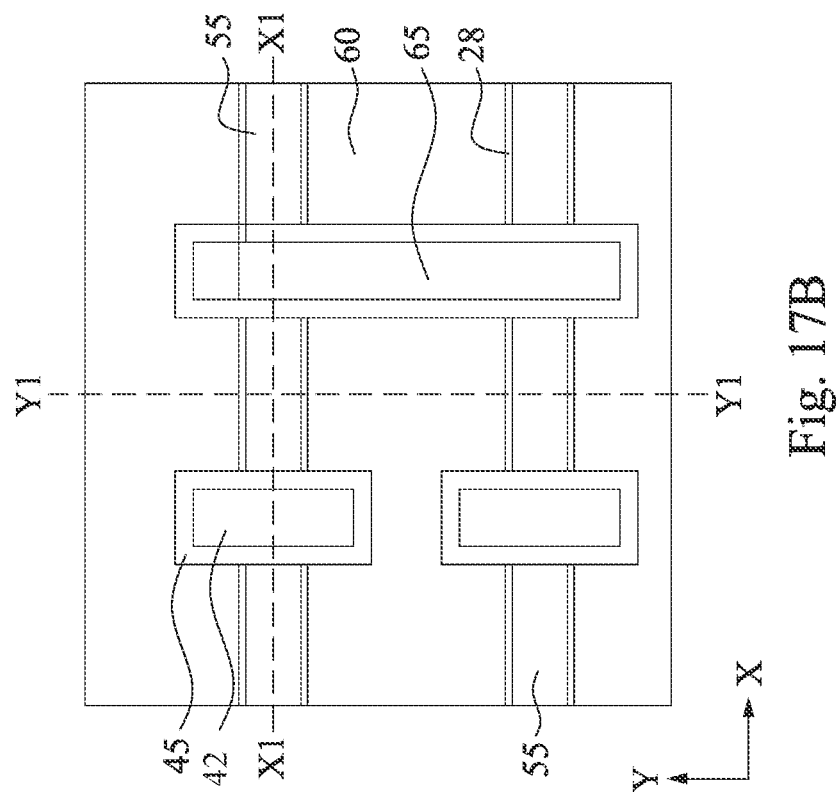
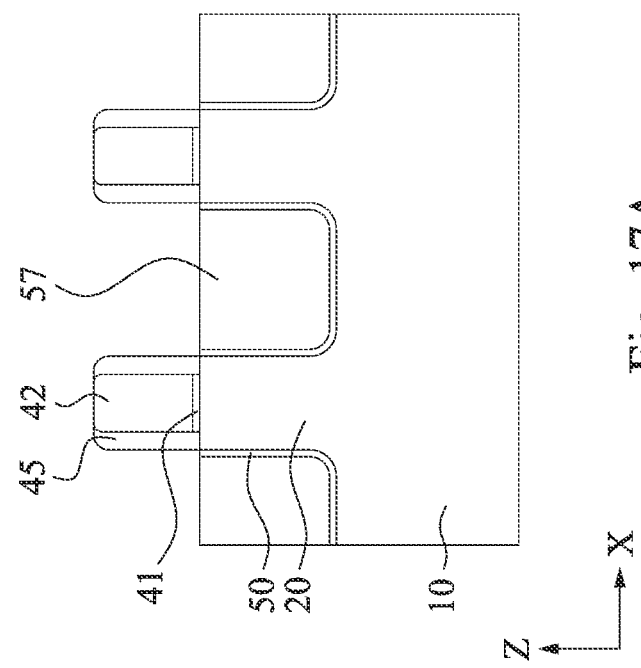
Fig. 17B
Fig. 17A

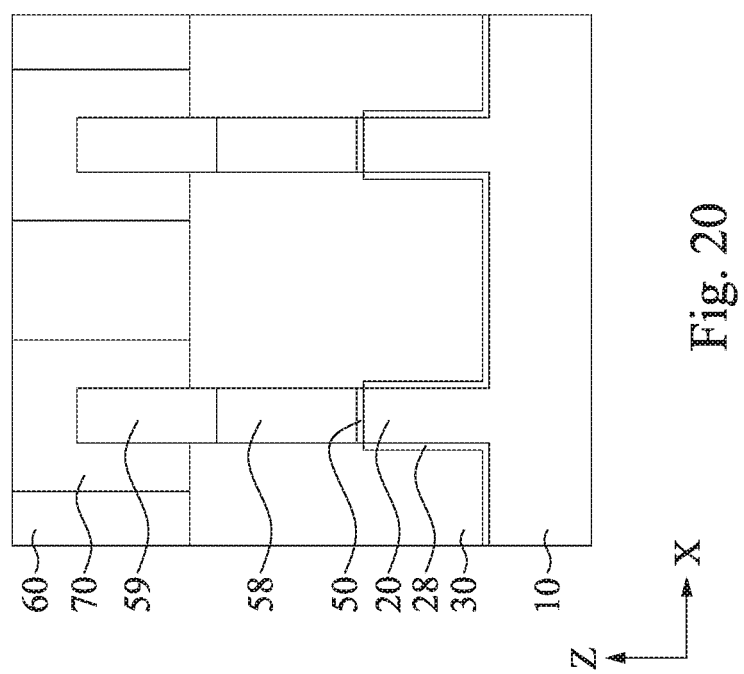

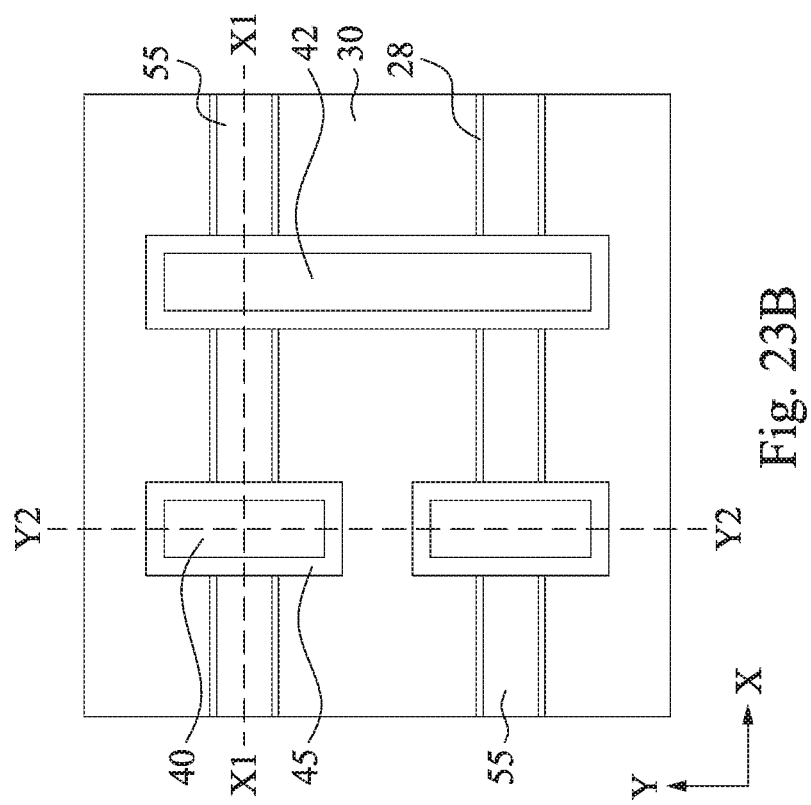
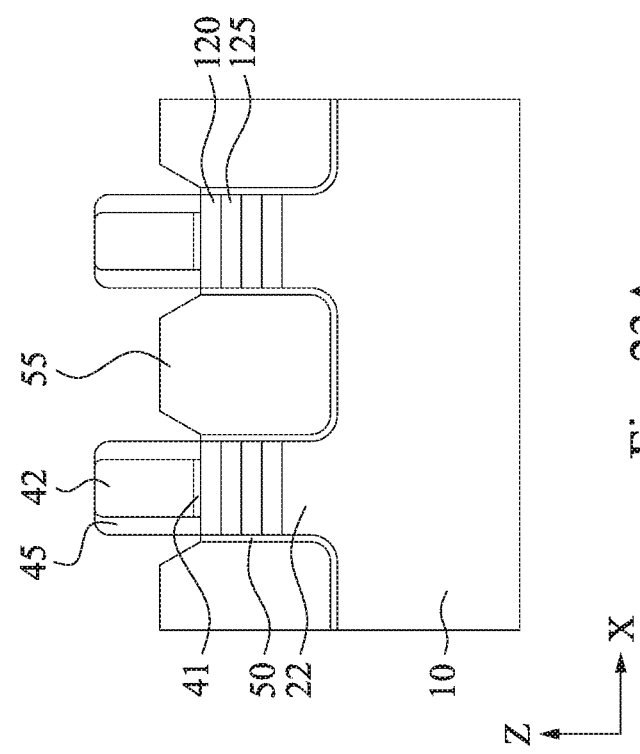
Fig. 23B
Fig. 23A

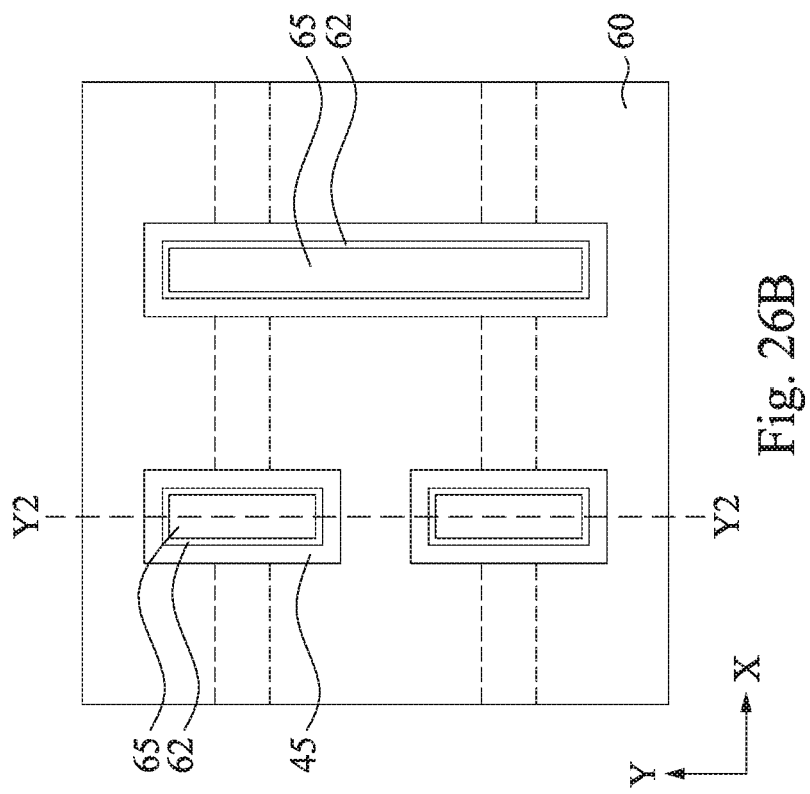
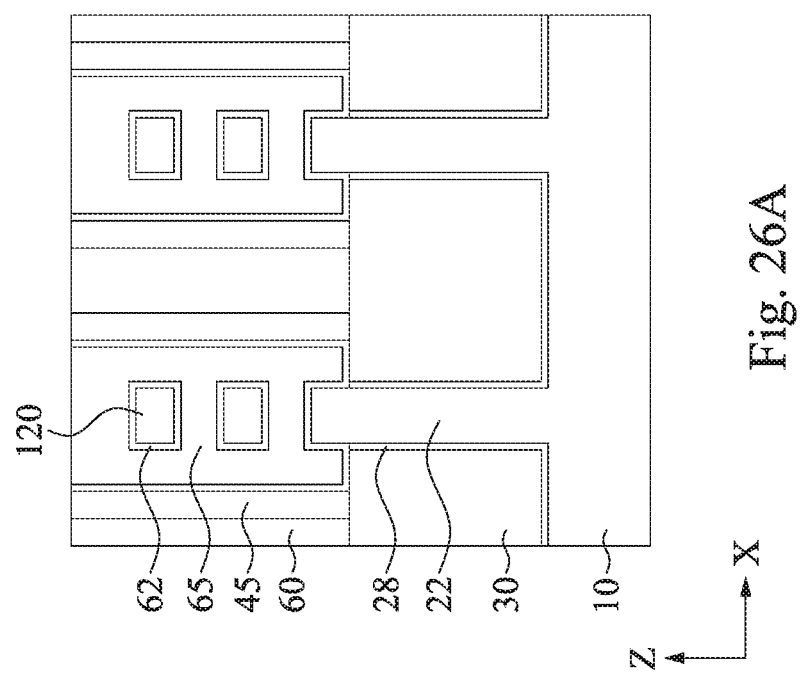
Fig. 26A
Fig. 26B

METHOD OF MANUFACTURING FINFETS HAVING BARRIER LAYERS WITH SPECIFIED SIGE DOPING CONCENTRATION

RELATED APPLICATIONS

This application claims priority of U.S. Provisional Application No. 62/736,708 filed on Sep. 26, 2018, the entire contents of which are incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (FinFET) and a gate-all-around (GAA) FET. In a FinFET, a gate electrode layer is adjacent to three side surfaces of a channel region with a gate dielectric layer interposed therebetween. Because the gate structure surrounds (wraps) the fin on three surfaces, the transistor essentially has three gates controlling the current through the fin or channel region. The current driving capacity of the FinFET is generally determined by a number of the fins, a fin width and a fin height at the channel region. Further, instead of silicon, silicon germanium or germanium will be used as a channel region of a FET.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A and 2B show one of the various stages of sequential processes for manufacturing a semiconductor device according to an embodiment of the present disclosure.

FIGS. 3A and 3B show one of the various stages of sequential processes for manufacturing a semiconductor device according to an embodiment of the present disclosure.

FIGS. 4A and 4B show one of the various stages of sequential processes for manufacturing a semiconductor device according to an embodiment of the present disclosure.

FIGS. 6A, 6B and 6C show one of the various stages of sequential processes for manufacturing a semiconductor device according to an embodiment of the present disclosure.

FIGS. 7A and 7B show one of the various stages of sequential processes for manufacturing a semiconductor device according to an embodiment of the present disclosure.

FIGS. 12A and 12B show one of the various stages of sequential processes for manufacturing a semiconductor device according to an embodiment of the present disclosure.

FIGS. 13A, 13B and 13C show one of the various stages of sequential processes for manufacturing a semiconductor device according to an embodiment of the present disclosure.

FIGS. 15A and 15B show one of the various stages of sequential processes for manufacturing a semiconductor device according to an embodiment of the present disclosure.

FIGS. 17A, 17B and 17C show one of the various stages of sequential processes for manufacturing a semiconductor device according to another embodiment of the present disclosure.

FIG. 20 shows one of the various stages of sequential processes for manufacturing a semiconductor device according to another embodiment of the present disclosure.

FIGS. 23A and 23B show one of the various stages of sequential processes for manufacturing a semiconductor device according to another embodiment of the present disclosure.

FIGS. 26A and 26B show one of the various stages of sequential processes for manufacturing a semiconductor device according to another embodiment of the present disclosure.

DETAILED DESCRIPTION

Figure 1A:
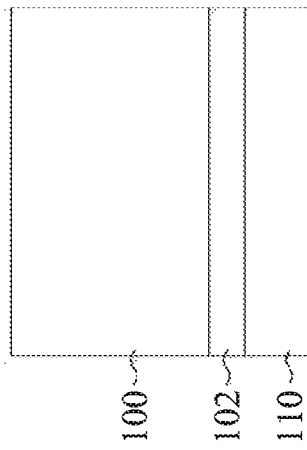
FIGS. 1A, 1B and 1C show cross sectional views of source/drain epitaxial layers for a semiconductor FET device according to embodiments of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of." In this disclosure, the phrase "at least one of A, B and C means "A, B and/or C" (A, B, C, A+B, A+C, B+C A+B+C), and does not mean one from A, one from B and one from C, unless otherwise described.

With the decrease of dimensions of semiconductor devices, for example, FinFETs and GAA FETs, structures and/or configurations of source/drain regions need to be improved to decrease contact resistance between a conductive contact (metallic layer) and the source/drain regions (semiconductor), and to provide appropriate stress to a channel region by the source/drain regions. To apply the stress to the source/drain regions of FinFETs or GAA FETs, one or more epitaxial semiconductor layers are formed. To decrease the contact resistance, a wrap-around contact that covers the top and side faces of the fin source/drain regions is employed.

For the next generation semiconductor devices, Ge or SiGe having a high Ge concentration will be used as a channel region due to the high carrier mobility. When Ge or SiGe is used for a fin structure of a FinFET, the source/drain region, which is a part of the fin structure, is also made of Ge or SiGe. For such a Ge or SiGe FinFET, the source/drain epitaxial layer includes Ge doped with phosphorous (P) (Ge:P), SiGe doped with P (SiGe:P) and/or Si doped with P (Si:P), for an n-type FET. For a p-type FET, one or more boron doped Ge, SiGe, and/or Si layers are used. However, a diffusion coefficient of P in Ge is about 1000 times that in Si (a diffusion coefficient of phosphorous at 450° C. of Ge is about $1\times 10^{-19}$ cm$^2$/s). Accordingly, P readily diffuses in Ge and P migration from the Ge:P into the channel region will degrade device performance, e.g., high Ioff, lower electron mobility, greater dielectric leakage and/or low reliability. In the present disclosure, source/drain epitaxial structures including a diffusion barrier layer for FinFETs and GAA FETs and fabrication method thereof are provided.

In the following embodiments, material, configurations, dimensions and/or processes of one embodiment may be employed in another embodiment, unless otherwise described, and detailed explanation thereof may be omitted. In the following embodiments, a semiconductor (e.g., Si, Ge, SiGe, etc), a semiconductor layer, and an epitaxial layer generally and the like refer to a single crystalline layer, unless otherwise explained. In this disclosure, the term "source/drain" refers to one of or both of a source and a drain, and "source" and "drain" are interchangeably used and the structures thereof are substantially the same.

Figure 1B:
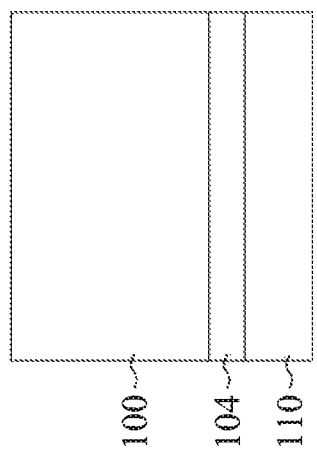
Figure 1C:
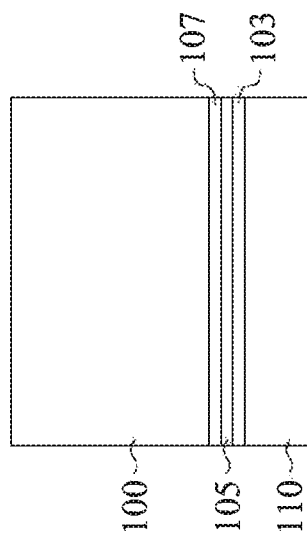

FIGS. 1A-1C show cross sectional views of source/drain epitaxial structures according to embodiments of the present disclosure. In FIGS. 1A-1C, a source/drain region 100 is a part of a fin structure. In some embodiments, the source/drain region 100 is a recessed fin structure having a lower top than a channel region of the fin structure. In some embodiments, the fin structure including the channel region and the source/drain region 100 is made of $Si_xGe_{1-x}$, where $0 \leq x \leq 0.3$. In certain embodiments, the fin structure including the channel region and the source/drain region 100 is made of Ge (x=0). In some embodiments, the fin structure including the channel region and the source/drain region 100 is not intentionally doped (undoped). If impurities are contained, an impurity concentration of the fin structure is less than $1\times 10^{18}$ atoms/cm$^3$ in some embodiments.

As shown in FIG. 1A-1C, an epitaxial semiconductor layer 110 is formed over the source/drain region 100. In some embodiments, the epitaxial semiconductor layer 110 is made of $Si_zGe_{1-z}$, where $0 \leq z \leq 0.3$. In certain embodiments, the epitaxial semiconductor layer 110 is made of Ge (z=0). In some embodiments, the epitaxial semiconductor layer 110 doped with impurities, such as P, As, Sb and/or B. In certain embodiments, the epitaxial semiconductor layer 110 is doped with P. In some embodiments, a concentration of phosphorous in the epitaxial semiconductor layer 110 (e.g., Ge:P) is in a range from $5\times 10^{19}$ atoms/cm$^3$ to $1\times 10^{20}$ atoms/cm$^3$.

In FIGS. 1A-1C, a diffusion barrier layer is disposed between the epitaxial semiconductor layer 110 and the source/drain region 100 to suppress impurity (e.g., P) diffusion from the epitaxial semiconductor layer 110 to the channel region via the source/drain region 100. More specifically, the diffusion barrier layer has a diffusion coefficient of phosphorous at 450° C. less than $1\times 10^{-21}$ cm$^2$/s, in some embodiments.

In FIG. 1A, a diffusion barrier layer 102 is a silicon based material, such as of $Si_yGe_{1-y}$, where $0.7 \leq y \leq 1.0$. In certain embodiments, a diffusion barrier layer 102 is a silicon (y=1) epitaxially formed on the source/drain region 100. A thickness of the diffusion barrier layer 102 is in a range from about 0.2 nm to about 0.8 nm in some embodiments, and is equal to or smaller than about 0.5 nm in other embodiments. In some embodiments, the diffusion barrier layer 102 is a single layer of Si. Since a diffusion coefficient of phosphorous at 450° C. of Si is about $8\times10^{-23}$ cm$^2$/s, a Si layer is an effective diffusion barrier layer for phosphorous (P).

In FIG. 1B, a diffusion barrier layer 104 is a SiGe based material epitaxially formed on the source/drain region 100, such as of $Si_y Ge_{1-y}$, where $0.45 \leq y \leq 0.7$. In certain embodiments, $0.5 \leq y \leq 0.7$. A thickness of the diffusion barrier layer 104 is in a range from about 0.2 nm to about 0.8 nm in some embodiments, and is equal to or smaller than about 0.5 nm in other embodiments. In some embodiments, the diffusion barrier layer 104 is a single layer of SiGe. Since a diffusion coefficient of phosphorous at 450° C. of $Si_{0.6}Ge_{0.4}$ is about $1\times10^{-22}$ cm$^2$/s, a SiGe layer having a Si concentration equal to or more than 0.5 is an effective diffusion barrier layer for phosphorous (P).

In FIG. 1C, the diffusion barrier layer includes three layers, a first barrier semiconductor layer 103, a second barrier semiconductor layer 105 and a third barrier semiconductor layer 107. In some embodiments, the first barrier semiconductor layer is made of $Si_{y1}Ge_{1-y1}$, where $0.2 \leq y1 \leq 0.7$, the second barrier semiconductor layer is made of $Si_{y2}Ge_{1-y2}$, where $0.45 \leq y2 \leq 1.0$, and the third barrier semiconductor layer is made of $Si_{y3}Ge_{1-y3}$, where $0.2 \leq y3 \leq 0.7$. In some embodiments, $y1 > x$, $y2 > y1$, $y2 > y3$, and $y3 > z$ are satisfied. In certain embodiments, $y2=1.0$. A thickness of each of the first to third barrier semiconductor layer 103, 105 and 107 is in a range from about 0.2 nm to about 0.8 nm in some embodiments, and is equal to or smaller than about 0.5 nm in other embodiments. In some embodiments, the thickness of the second barrier semiconductor layer 105 is smaller than the thickness of the first and third barrier semiconductor layer 103 and 107. By using the first and third barrier semiconductor layer having a Si concentration greater than the source/drain region 100 and the epitaxial semiconductor 110 and having the Si concentration smaller than the second barrier semiconductor layer 105, it is possible to reduce strain caused by lattice mismatch, which can also reduce interface states.

In some embodiments, one of the first and third barrier semiconductor layers 103 and 107 is omitted (two layer structure). In other embodiments, more than three (e.g., 4-8) barrier semiconductor layers are formed.

FIGS. 2A-15B show sequential processes for manufacturing a semiconductor device having FinFETs with a barrier semiconductor layer in a source/drain epitaxial structure according to an embodiment of the present disclosure. It is understood that additional operations can be provided before, during, and after processes shown by FIGS. 2A-15B, and some of the operations described below can be replaced or eliminated, for additional embodiments of the method. The order of the operations/processes may be interchangeable.

FIGS. 2A and 2B show one of the various stages of sequential processes for manufacturing a semiconductor device having FinFETs with a barrier semiconductor layer in a source/drain structure according to an embodiment of the present disclosure. FIG. 2A is a cross sectional view corresponding to line Y1-Y1 of FIG. 2B.

As shown in FIGS. 2A and 2B, one or more fin structures 20 are formed over a semiconductor substrate 10. In one embodiment, the substrate 10 includes a single crystalline semiconductor layer on at least its surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In one embodiment, the substrate 10 is made of Ge or has a Ge layer at the surface of the substrate. In other embodiments, the substrate 10 is made of $Si_x Ge_{1-x}$, where $0 < x \leq 0.3$ or has a $Si_x Ge_{1-x}$ layer at the surface of the substrate 10.

The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer. The substrate 10 may include various regions that have been suitably doped with impurities (e.g., p-type or n-type conductivity).

The fin structures 20 may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a dummy layer is formed over a substrate and patterned using a photolithography process. Spacers are formed alongside the patterned dummy layer using a self-aligned process. The dummy layer is then removed, and the remaining spacers may then be used to pattern the fins.

In other embodiments, the fin structures can be patterned by using a hard mask pattern 21 as an etching mask. In some embodiments, the hard mask pattern 21 includes a first mask layer and a second mask layer disposed on the first mask layer. The first mask layer is a pad oxide layer made of a silicon oxide, which can be formed by a thermal oxidation. The second mask layer is made of silicon nitride, which is formed by chemical vapor deposition (CVD), including low pressure CVD (LPCVD) and plasma enhanced CVD (PECVD), physical vapor deposition (PVD), atomic layer deposition (ALD), or other suitable process. The deposited hard mask layer is patterned into a hard mask pattern 21 by using patterning operations including photo-lithography and etching. Then, the substrate 10 is patterned by using the hard mask pattern into fin structures 20, both extending in the X direction. In FIGS. 2A and 2B, two fin structures 20 are arranged in the Y direction. But the number of the fin structures is not limited to two, and may be one or three or more. In some embodiments, one or more dummy fin structures are formed on both sides of the fin structures to improve pattern fidelity in the patterning operations.

The width of the upper portion of the fin structures 20 along the Y direction is in a range from about 5 nm to about 40 nm in some embodiments, and is in a range from about 10 nm to about 20 nm in other embodiments. The height along the Z direction of the fin structure is in a range from about 100 nm to about 200 nm in some embodiments.

FIGS. 3A and 3B show one of the various stages of sequential processes for manufacturing a semiconductor device having FinFETs with a barrier semiconductor layer in a source/drain structure according to an embodiment of the present disclosure. FIG. 3A is a cross sectional view corresponding to line Y1-Y1 of FIG. 3B.

After the fin structures 20 are formed, a first insulating material layer 29 including one or more layers of insulating material is formed over the substrate 10 so that the fin structures 20 are fully embedded in the first insulating material layer 29. The insulating material for the first insulating material layer 29 may include silicon oxide, silicon nitride, silicon oxynitride (SiON), SiCN, fluorine-doped silicate glass (FSG), or a low-K dielectric material, formed by LPCVD (low pressure chemical vapor deposition), plasma-CVD or flowable CVD or any other suitable film formation methods. In some embodiments, the first insulating material layer 29 is made of silicon oxide. An annealing operation may be performed after the formation of the first insulating material layer 29. Then, a planarization operation, such as a chemical mechanical polishing (CMP) method and/or an etch-back method, is performed such that the hard mask patterns 21 are removed and upper surfaces of the fin structures 20 are exposed from the first insulating material layer 29 as shown in FIG. 3A.

In some embodiments, one or more fin liner layers 28 are formed over the fin structures before forming the first insulating material layer 29. The fin liner layer 28 may be made of silicon nitride or a silicon nitride-based material (e.g., SiON or SiCN).

FIGS. 4A and 4B show one of the various stages of sequential processes for manufacturing a semiconductor device having FinFETs with a barrier semiconductor layer in a source/drain structure according to an embodiment of the present disclosure. FIG. 4A is a cross sectional view corresponding to line Y1-Y1 of FIG. 4B.

Then, as shown in FIG. 4A, the first insulating material layer 29 is recessed to form a first isolation insulating layer 30 so that the upper portions of the fin structures 20 are exposed. With this operation, the fin structures 20 are electrically separated from each other by the first isolation insulating layer 30, which is also called a shallow trench isolation (STI). After the recess etching, the height H1 of the exposed fin structures is in a range from about 30 nm to about 100 nm in some embodiments, and is in a range from about 40 nm to about 80 nm in other embodiments.

Figure 5B:
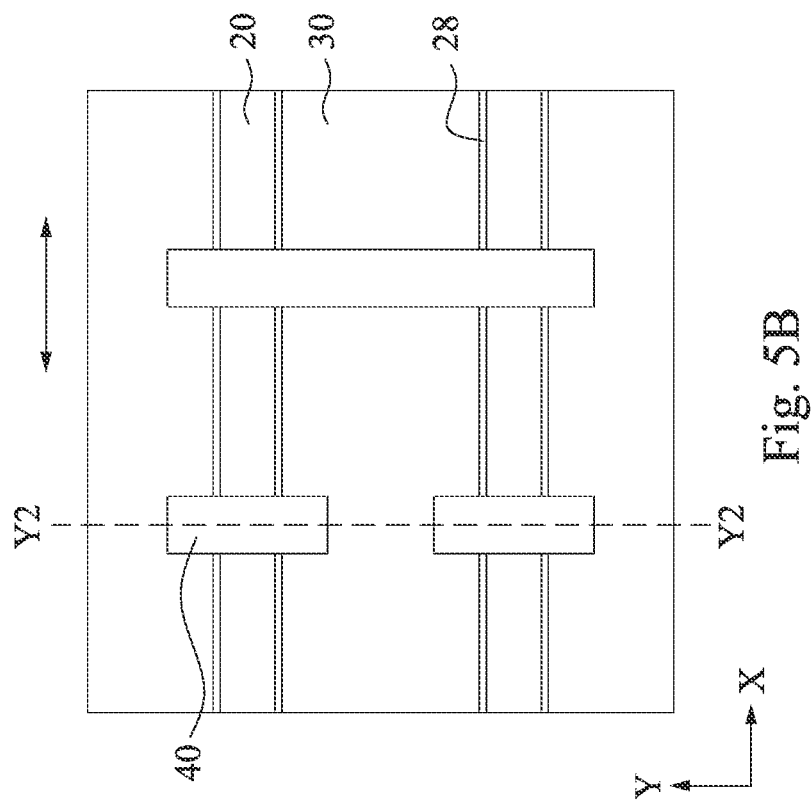
FIGS. 5A and 5B show one of the various stages of sequential processes for manufacturing a semiconductor device according to an embodiment of the present disclosure.
Figure 5A:
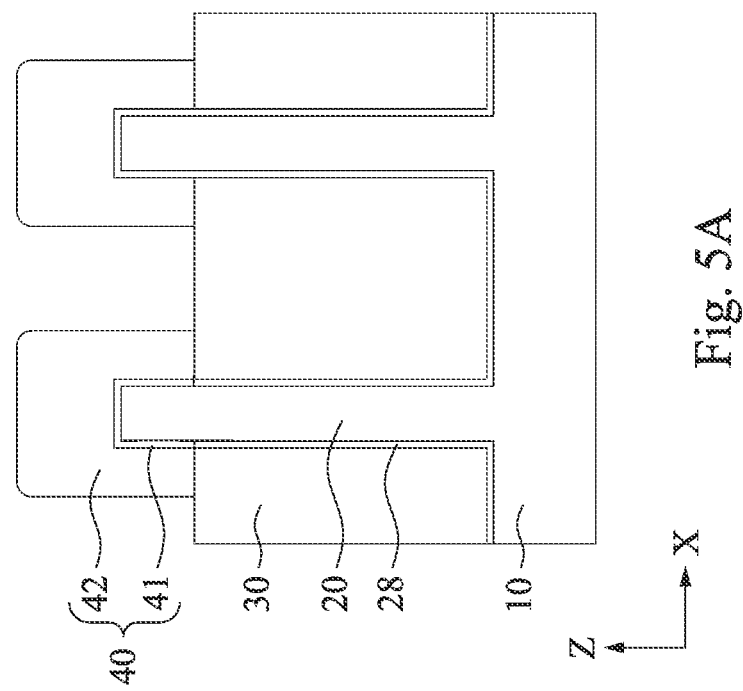

FIGS. 5A and 5B show one of the various stages of sequential processes for manufacturing a semiconductor device having FinFETs with a barrier semiconductor layer in a source/drain structure according to an embodiment of the present disclosure. FIG. 5A is a cross sectional view corresponding to line Y2-Y2 of FIG. 5B.

After the isolation insulating layer 30 is formed, a dummy gate structure 40 is formed, as shown in FIGS. 5A and 5B. The dummy gate structure 40 includes a dummy gate dielectric layer 41 and a dummy gate electrode layer 42. The dummy gate dielectric layer 41 includes one or more layers of insulating material, such as a silicon oxide-based material. In one embodiment, silicon oxide formed by CVD is used. The thickness of the dummy gate dielectric layer 41 is in a range from about 1 nm to about 5 nm in some embodiments.

The dummy gate structure 40 is formed by first blanket depositing the dummy gate dielectric layer 41 over the exposed fin structures 20 and the upper surface of the isolation insulating layer 30. A dummy gate electrode layer 42 is then blanket deposited on the dummy gate dielectric layer 41, such that the fin structures 20 are fully embedded in the dummy gate electrode layer 42. The dummy gate electrode layer 42 includes silicon such as polycrystalline silicon (polysilicon) or amorphous silicon. In some embodiments, the dummy gate electrode layer 42 is made of polysilicon. The thickness of the dummy gate electrode layer 42 is in a range from about 100 nm to about 200 nm in some embodiments. In some embodiments, the dummy gate electrode layer 42 is subjected to a planarization operation. The dummy gate dielectric layer 41 and the dummy gate electrode layer 42 are deposited using CVD, including LPCVD and PECVD, PVD, ALD, or other suitable process. Subsequently, a mask layer is formed over the dummy gate electrode layer. The mask layer can be a resist pattern or a hard mask pattern.

Next, a patterning operation is performed on the mask layer and the dummy gate electrode layer 42 is patterned into the dummy gate structures 40, as shown in FIGS. 5A and 5B. By patterning the dummy gate structures, the upper portions of the fin structures 20, which are to be source/drain regions, are partially exposed on opposite sides of the dummy gate structures 40, as shown in FIG. 5B. In FIG. 5B, two dummy gate structures 40 are formed on two fin structures 20, respectively, and one dummy gate structure 40 is formed over two fin structures 20. However, the layout is not limited to FIG. 5B.

The width of the dummy gate structures 40 in the Y direction is in a range from about 5 nm to about 30 nm in some embodiments, and is in a range from about 7 nm to about 15 nm in other embodiments. A pitch of the dummy gate structures is in a range from about 10 nm to about 50 nm in some embodiments, and is in a range from about 15 nm to about 40 nm in other embodiments.

FIGS. 6A-6C show one of the various stages of sequential processes for manufacturing a semiconductor device having FinFETs with a barrier semiconductor layer in a source/drain structure according to an embodiment of the present disclosure. FIG. 6A is a cross sectional view corresponding to line Y2-Y2 of FIG. 6B and FIG. 6C is a cross sectional view corresponding to line X1-X1 of FIG. 6B.

After the dummy gate structures 40 are formed, a blanket layer of an insulating material for sidewall spacers 45 is conformally formed by using CVD or other suitable methods. The blanket layer is deposited in a conformal manner so that it is formed to have substantially equal thicknesses on vertical surfaces, such as the sidewalls, horizontal surfaces, and the top of the dummy gate structures. In some embodiments, the blanket layer is deposited to a thickness in a range from about 2 nm to about 20 nm. In one embodiment, the insulating material of the blanket layer is different from the materials of the first isolation insulating layer and the second isolation insulating layer, and is made of a silicon nitride-based material, such as silicon nitride, SiON, SiOCN or SiCN and combinations thereof. In some embodiments, the blanket layer (sidewall spacers 45) is made of silicon nitride. The sidewall spacers 45 are formed on opposite sidewalls of the dummy gate structures 40, by anisotropic etching, as shown in FIGS. 6A and 6B.

FIGS. 7A and 7B show one of the various stages of sequential processes for manufacturing a semiconductor device having FinFETs with a barrier semiconductor layer in a source/drain structure according to an embodiment of the present disclosure. FIG. 7A is a cross sectional view corresponding to line X1-X1 of FIG. 7B.

Subsequently, source/drain regions of the fin structures 20 not covered by the dummy gate structure 40 and the sidewall spacers 45 are recessed down below an upper surface 31 of the isolation insulating layer 30.

Figure 8B:
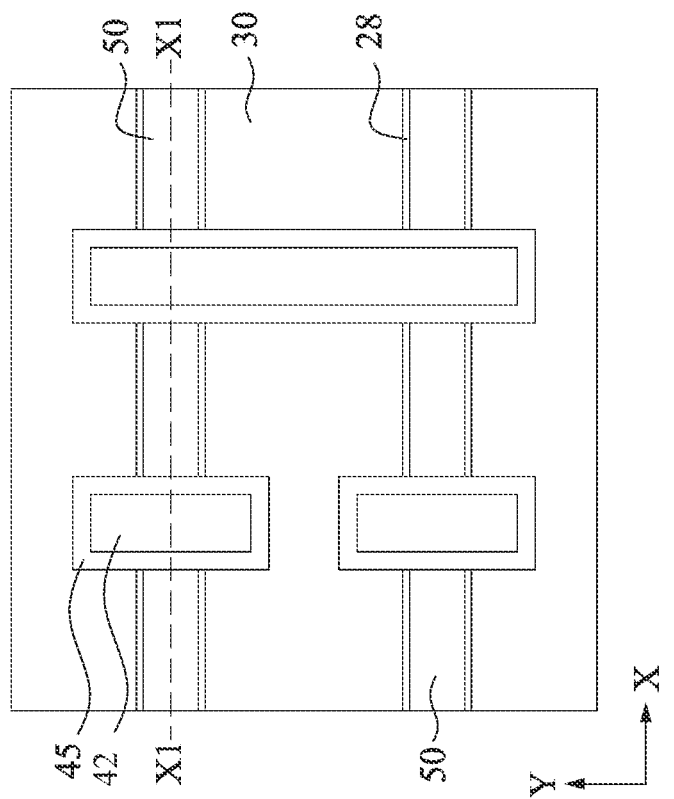
FIGS. 8A and 8B show one of the various stages of sequential processes for manufacturing a semiconductor device according to an embodiment of the present disclosure.
Figure 8A:
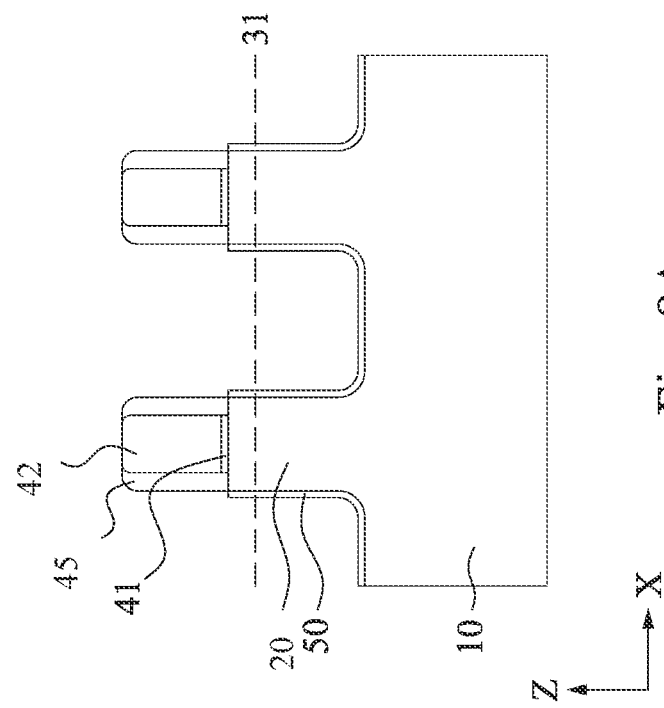

FIGS. 8A and 8B show one of the various stages of sequential processes for manufacturing a semiconductor device having FinFETs with a barrier semiconductor layer in a source/drain structure according to an embodiment of the present disclosure. FIG. 8A is a cross sectional view corresponding to line X1-X1 of FIG. 8B.

After the source/drain regions are recessed, one or more barrier semiconductor layers 50 are formed on inner surfaces of the recessed source/drain regions. The barrier semiconductor layer 50 is one or more of the diffusion barrier layers shown in FIGS. 1A-1C. The barrier semiconductor layer 50 can be epitaxially formed on the source/drain regions of the fin structures 20 by using a metal-organic CVD (MOCVD), molecular beam epitaxy (MBE), ALD or any other film formation methods. In some embodiments, a $Si_2H_6$ gas is used as a source gas of Si and a $Ge_2H_6$ gas is used as a source gas of Ge. In certain embodiments, instead of or, in addition to, $Ge_2H_6$ and/or $Si_2H_6$, $GeH_4$ and/or $SiH_4$ is used. One or more inert gas, such as $H_2$, He, Ar and/or $N_2$, is used as a dilution gas. The bottom most part of the barrier semiconductor layer 50 in contact with the recessed source/drain region of the fin structure 20 is located below the upper surface 31 of the isolation insulating layer 30.

Figure 9B:
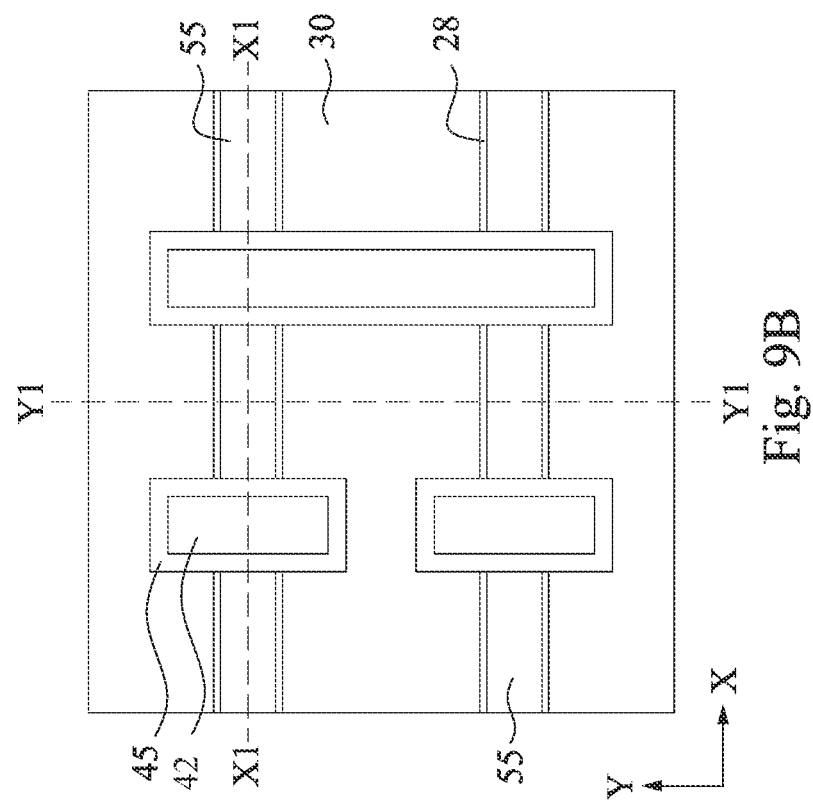
FIGS. 9A, 9B and 9C show one of the various stages of sequential processes for manufacturing a semiconductor device according to an embodiment of the present disclosure.
Figure 9A:
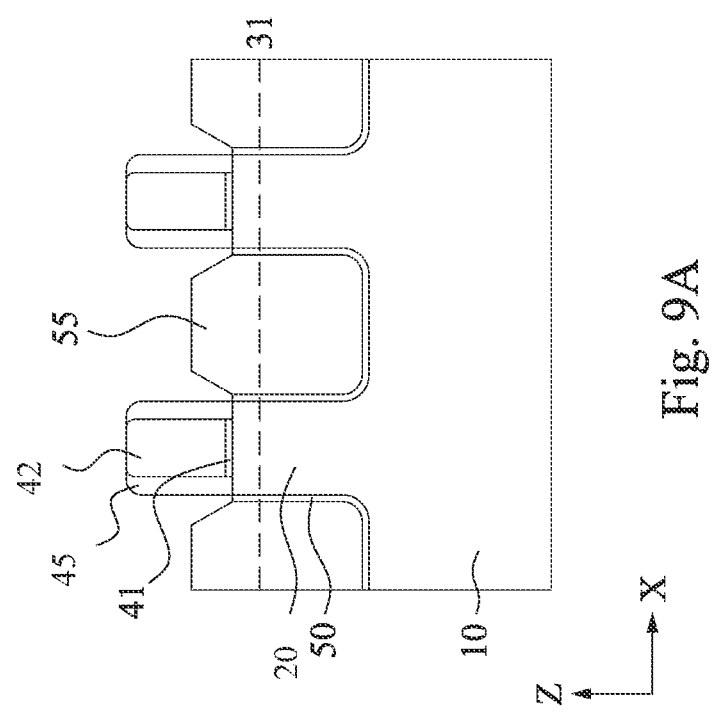

FIGS. 9A and 9B show one of the various stages of sequential processes for manufacturing a semiconductor device having FinFETs with a barrier semiconductor layer in a source/drain structure according to an embodiment of the present disclosure. FIG. 9A is a cross sectional view corresponding to line X1-X1 of FIG. 9B.

After the barrier semiconductor layer 50 is formed, one or more source/drain epitaxial semiconductor layers 55 are formed over the barrier semiconductor layer 50 as shown in FIGS. 9A and 9B. In some embodiments, the source/drain epitaxial layer 55 includes Ge doped with phosphorous (Ge:P) or $Si_zGe_{1-z}$ doped with P (SiGe:P), where $0<z\leq0.3$, for n-type FETs. In other embodiments, As and/or Sb are used as impurities instead of or in addition to P. In some embodiments, an amount of P in the Ge:P layer or the SiGe:P layer is in a range from about $1\times10^{19}$ atoms/$cm^3$ to $1\times10^{20}$ atoms/$cm^3$. In other embodiments, the amount of P is in a range from about $5\times10^{19}$ atoms/$cm^3$ to $8\times10^{19}$ atoms/$cm^3$. In other embodiments, boron (B) is doped for p-type FETs, in a range from about $1\times10^{19}$ atoms/$cm^3$ to $1\times10^{20}$ atoms/$cm^3$, or in a range from about $2\times10^{19}$ atoms/$cm^3$ to $8\times10^{19}$ atoms/$cm^3$.

The Ge:P layer can be epitaxially formed on the source/drain regions of the fin structures 20 by using a metal-organic CVD (MOCVD), molecular beam epitaxy (MBE), ALD or any other film formation methods. In some embodiments, a $Ge_2H_6$ gas is used as a source gas of Ge. In some embodiments, a $Si_2H_6$ gas is used as a source gas of Si. In certain embodiments, instead of or, in addition to, $Ge_2H_6$ and/or $Si_2H_6$, $GeH_4$ and/or $SiH_4$ is used. One or more inert gas, such as $H_2$, He, Ar and/or $N_2$, is used as a dilution gas.

Figure 9C:
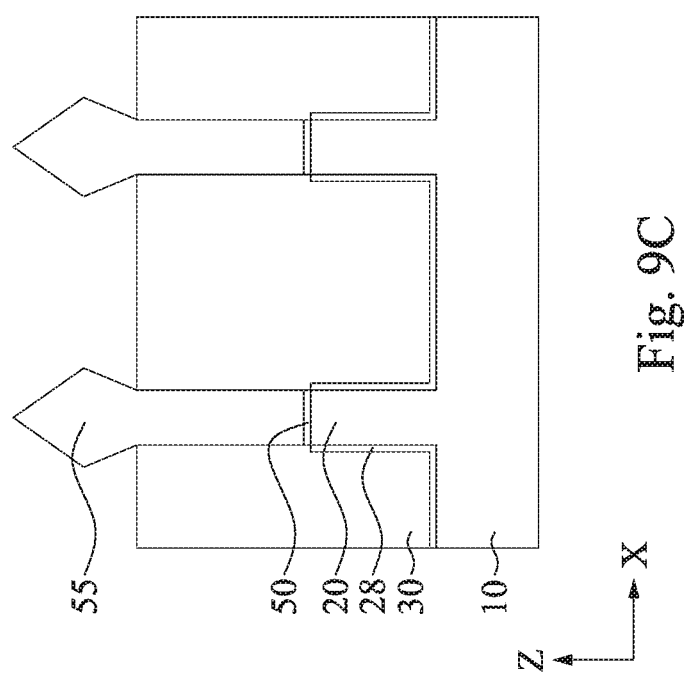

In some embodiments, as shown in FIG. 9C, the source/drain epitaxial layer 55 protrudes from the upper surface of the isolation insulating layer 30 and has a diamond or hexagonal cross sectional shape.

Figure 10B:
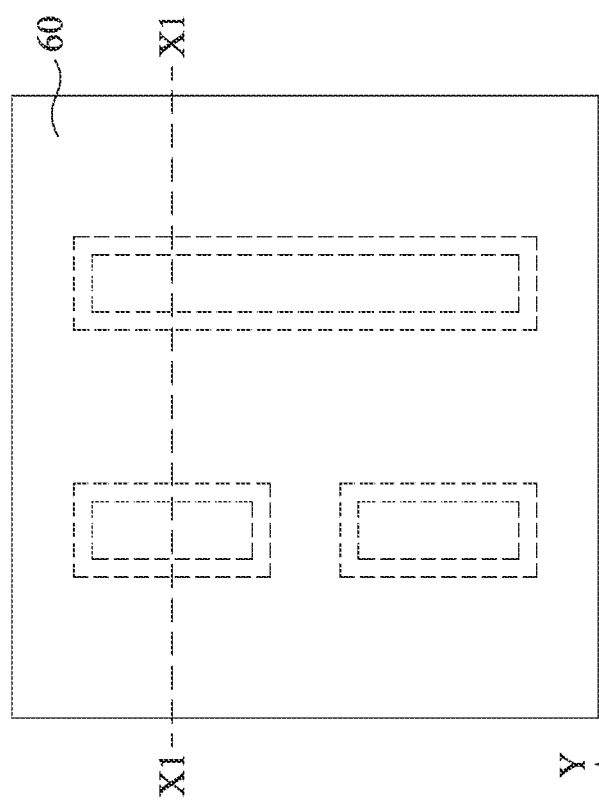
FIGS. 10A and 10B show one of the various stages of sequential processes for manufacturing a semiconductor device according to an embodiment of the present disclosure.
Figure 10A:
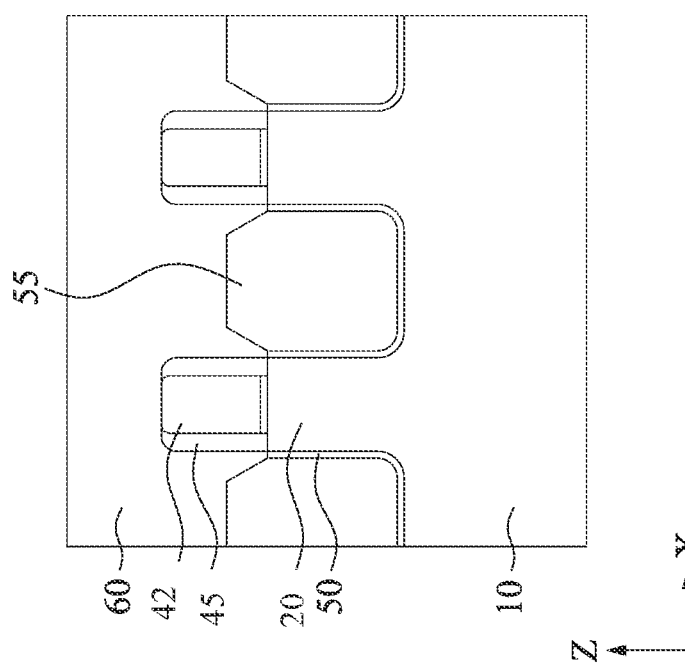

FIGS. 10A-11B show one of the various stages of sequential processes for manufacturing a semiconductor device having FinFETs with a barrier semiconductor layer in a source/drain structure according to an embodiment of the present disclosure. FIGS. 10A and 11A are cross sectional views corresponding to line X1-X1 of FIGS. 10B and 11B.

Figure 11B:
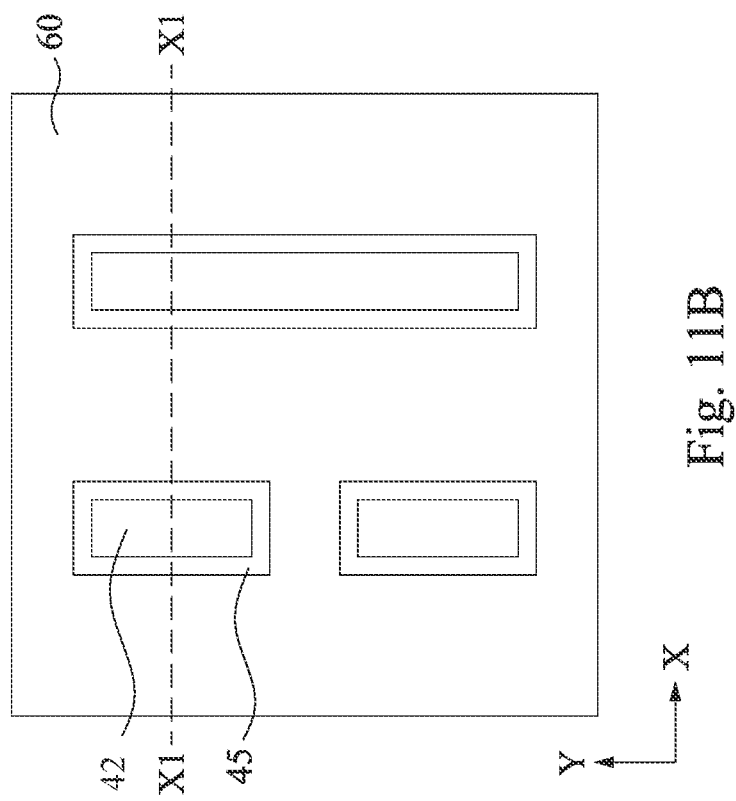
FIGS. 11A and 11B show one of the various stages of sequential processes for manufacturing a semiconductor device according to an embodiment of the present disclosure.
Figure 11A:
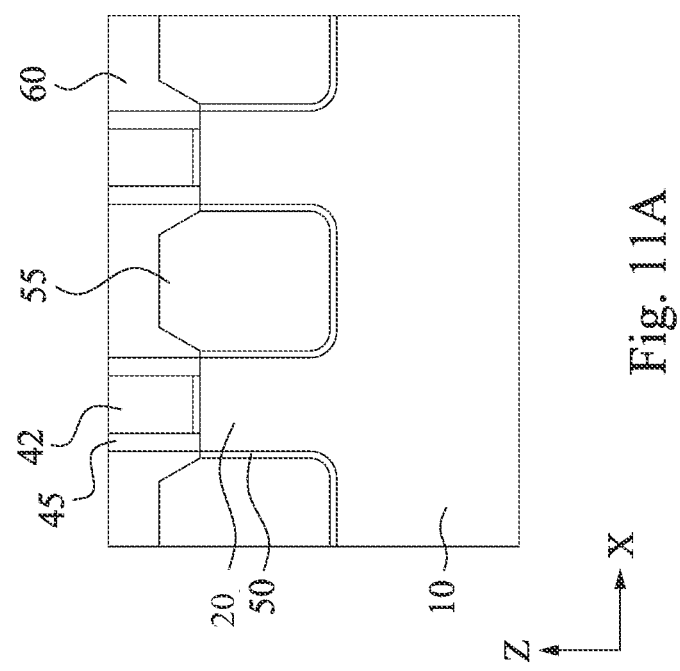

Subsequently, an interlayer dielectric (ILD) layer 60 is formed. The materials for the ILD layer 60 include compounds comprising Si, O, C and/or H, such as silicon oxide, SiCOH and SiOC. Organic materials, such as polymers, may be used for the ILD layer 60. After the ILD layer 60 is formed, a planarization operation, such as CMP, is performed, so that the top portions of the dummy gate electrode layers of the dummy gate structures 40 are exposed, as shown in FIG. 11A. In some embodiments, a hard mask layer (not shown) is used to pattern the dummy gate structure 40, and the planarization operation removes the hard mask layer in some embodiments.

FIGS. 12A and 12B show one of the various stages of sequential processes for manufacturing a semiconductor device having FinFETs with a barrier semiconductor layer in a source/drain structure according to an embodiment of the present disclosure. FIG. 12A is a cross sectional view corresponding to line X1-X1 of FIG. 12B.

Next, as shown in FIGS. 12A and 12B, the dummy gate structures 40 (the dummy gate dielectric layer 41 and the dummy gate electrode layer 42) are removed, thereby forming gate openings 48, in which the upper portions of the fin structures 20 are exposed, respectively. The sidewall spacers 45 are not removed in some embodiments.

The ILD layer 50 protects the source/drain epitaxial structure during the removal of the dummy gate structures 40. The dummy gate structures 40 can be removed using plasma dry etching and/or wet etching. When the dummy gate electrode layer is polysilicon and the ILD layer 50 is silicon oxide, a wet etchant such as a tetramethylammonium hydroxide (TMAH) solution can be used to selectively remove the dummy gate electrode layer. The dummy gate dielectric layer is thereafter removed using plasma dry etching and/or wet etching.

FIGS. 13A-13C show one of the various stages of sequential processes for manufacturing a semiconductor device having FinFETs with a barrier semiconductor layer in a source/drain structure according to an embodiment of the present disclosure. FIG. 13A is a cross sectional view corresponding to line X1-X1 of FIG. 13B and FIG. 13C is a cross sectional view corresponding to line Y1-Y1 of FIG. 13B.

Then, a gate dielectric layer 62 is formed in the gate opening 48 over the exposed fin structures 20, which are channel regions, and the surrounding areas, as shown in FIGS. 13A and 13B. In certain embodiments, the gate dielectric layer 62 includes one or more layers of a dielectric material, such as silicon oxide, silicon nitride, or a high-k dielectric material, other suitable dielectric material, and/or combinations thereof. Examples of high-k dielectric materials include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 62 includes an interfacial layer formed between the channel layers and the dielectric material, by using chemical oxidation.

The gate dielectric layer 62 may be formed by CVD, ALD or any suitable method. In one embodiment, the gate dielectric layer 62 is formed using a highly conformal deposition process such as ALD in order to ensure the formation of a gate dielectric layer having a uniform thickness around each channel layers. The thickness of the gate dielectric layer 62 is in a range from about 1 nm to about 6 nm in one embodiment.

Subsequently, a gate electrode layer 65 is formed on the gate dielectric layer 62. The gate electrode layer 65 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 65 may be formed by CVD, ALD, electro-plating, or other suitable method. The gate dielectric layer 62 and the electrode layer 65 are also deposited over the upper surface of the ILD layer 60. The gate dielectric layer and the gate electrode layer formed over the ILD layer 60 are then planarized by using, for example, CMP, until the top surface of the ILD layer 60 is revealed, as shown in FIG. 13A.

In certain embodiments of the present disclosure, one or more work function adjustment layers (not shown) are interposed between the gate dielectric layer 62 and the gate electrode layer 65. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

FIG. 13C shows the source/drain regions of the fin structures 20 after the gate electrode layer 65 is formed. As shown in FIG. 13C, the source/drain epitaxial layer 55 is covered by the ILD layer 60. As shown in FIG. 13C, the barrier semiconductor layer 50 is disposed below the interface between the isolation insulating layer 30 and the ILD layer 60.

Figure 14B:
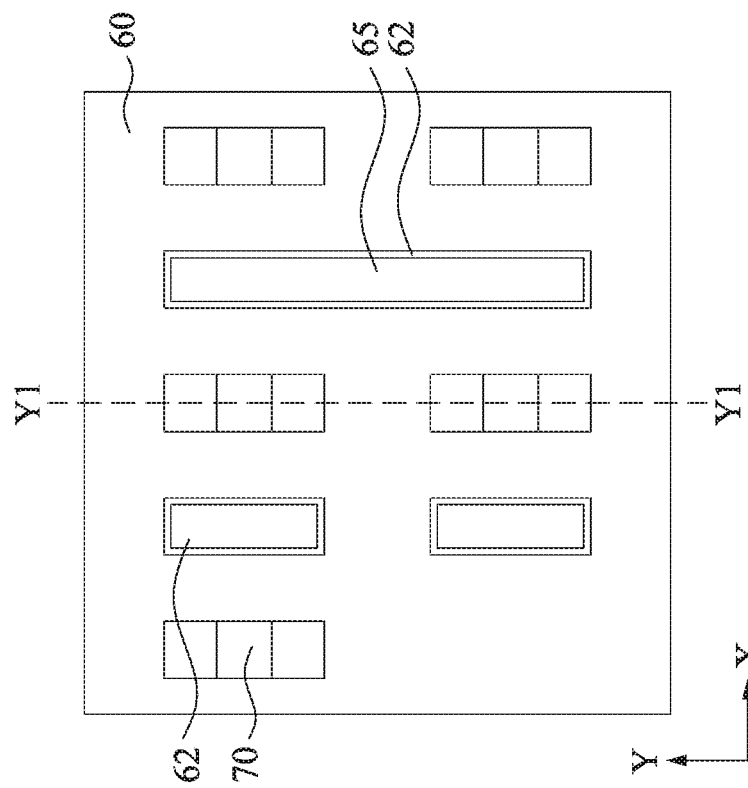
FIGS. 14A and 14B show one of the various stages of sequential processes for manufacturing a semiconductor device according to an embodiment of the present disclosure.
Figure 14A:
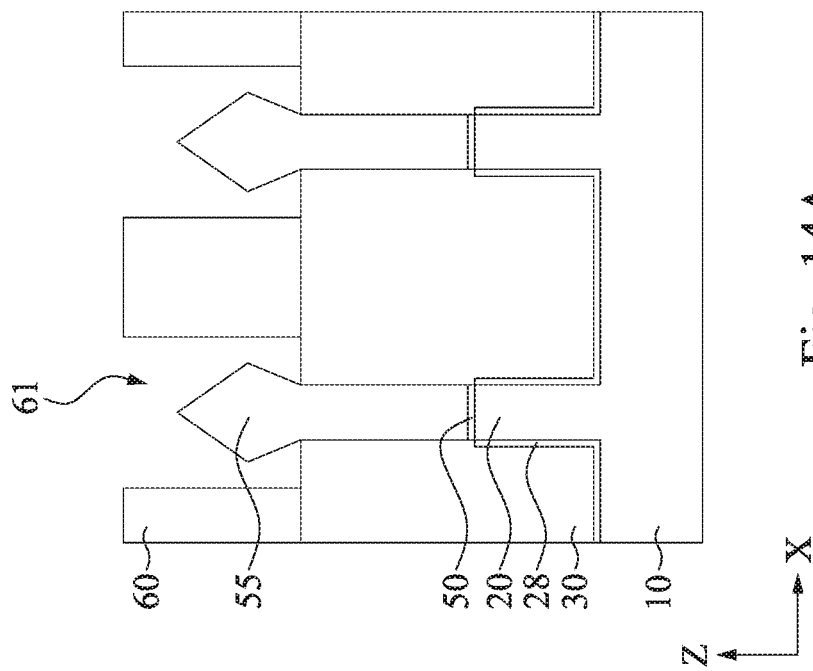

FIGS. 14A and 14B show one of the various stages of sequential processes for manufacturing a semiconductor device having FinFETs with a barrier semiconductor layer in a source/drain structure according to an embodiment of the present disclosure. FIG. 14A is a cross sectional view corresponding to line Y1-Y1 of FIG. 14B.

As shown in FIGS. 14A and 14B, the ILD layer 60 is patterned by one or more lithography and etching operations, thereby forming a source/drain opening 61. In the source/drain opening 61, the source/drain epitaxial layer 55 formed over fin structure 20 is exposed. In FIGS. 14A and 14B, one source/drain opening 61 is formed to expose a portion of one source/drain epitaxial layer 55. However, the configuration is not limited to this. In some embodiments, one source/drain opening 61 is formed over two source/drain epitaxial layers 55 formed over two separate fin structures, and in other embodiments, one source/drain opening 61 is formed over three or more source/drain epitaxial layers 55 of three or more fin structures.

FIGS. 15A and 15B show one of the various stages of sequential processes for manufacturing a semiconductor device having FinFETs with a barrier semiconductor layer in a source/drain structure according to an embodiment of the present disclosure. FIG. 15A is a cross sectional view corresponding to line Y1-Y1 of FIG. 15B.

Figure 18B:
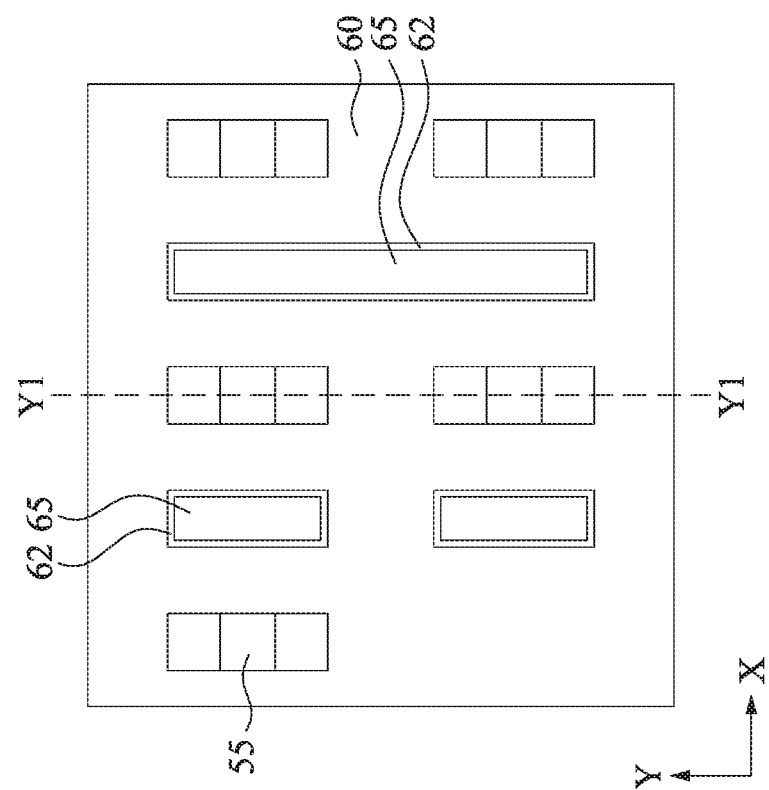
FIGS. 18A and 18B show one of the various stages of sequential processes for manufacturing a semiconductor device according to another embodiment of the present disclosure.
Figure 18A:
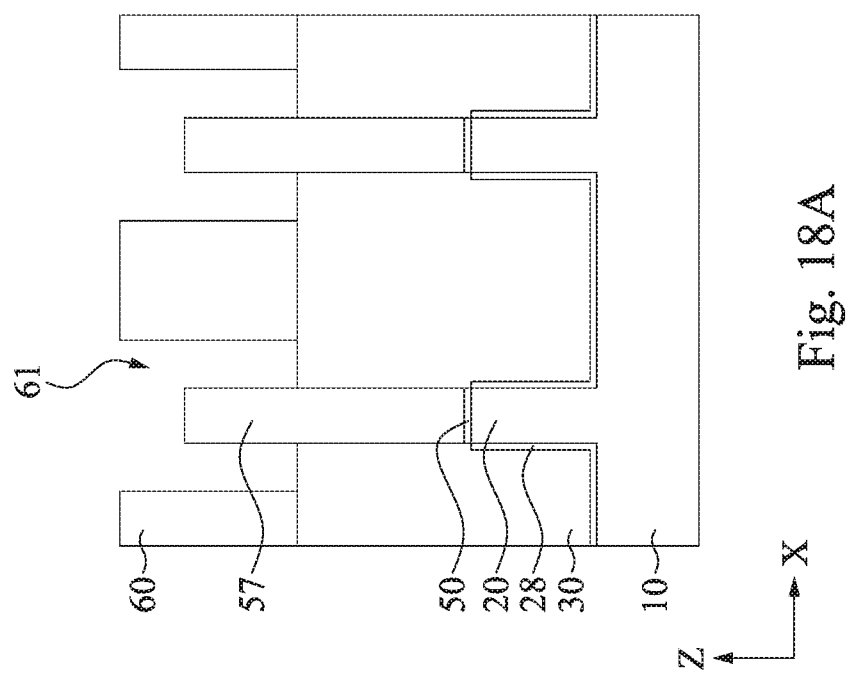

After the source/drain opening 61 is formed, a conductive contact 70 is formed, as shown in FIGS. 15A and 15B. One or more layers of conductive materials are formed in the remaining portion of the contact opening 61. One or more layers of conductive materials are formed in and over the contact openings and then a planarization operation, such as a CMP operation, is performed to form contact 70, as shown in FIGS. 18A and 18B. In some embodiments, the contact 70 includes a liner layer and a body layer. The liner layer is a barrier layer and/or a glue (adhesion) layer. In some embodiments, a Ti layer is formed on the source/drain epitaxial layer 55 and a TiN or TaN layer is formed on the Ti layer, as the liner layer. The body layer includes one or more layers of Co, Ni, W, Ti, Ta, Cu and Al, or any other suitable material. As shown in FIGS. 15A and 15B, the conductive contact 70 wraps around the source/drain epitaxial layer 55.

Figure 16B:
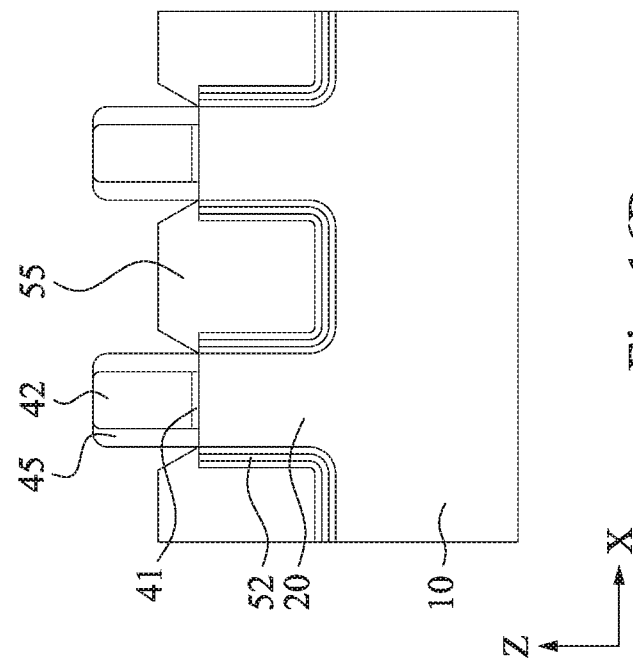
FIGS. 16A and 16B show various stages of sequential processes for manufacturing a semiconductor device according to another embodiment of the present disclosure.
Figure 16A:
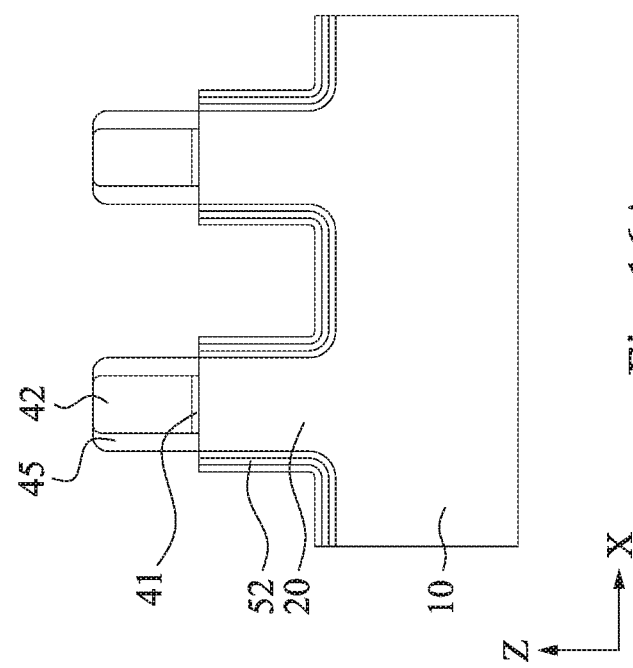

FIGS. 16A and 16B show various stages of sequential processes for manufacturing a semiconductor device according to another embodiment of the present disclosure.

As shown in FIG. 16A, a multi-layer barrier semiconductor layer 52 which is the same as the diffusion barrier layers 103, 105 and 107 shown in FIG. 1C is formed on the inner surface of the recessed source/drain region. FIG. 16B shows a structure after the source/drain epitaxial layer 56 is formed.

FIGS. 17A-19B show sequential processes for manufacturing a semiconductor device having FinFETs with a barrier semiconductor layer in a source/drain epitaxial structure according to an embodiment of the present disclosure. It is understood that additional operations can be provided before, during, and after processes shown by FIGS. 17A-19B, and some of the operations described below can be replaced or eliminated, for additional embodiments of the method. The order of the operations/processes may be interchangeable.

In this embodiment, the source/drain epitaxial layer 57 does not have a diamond or a hexagonal shape, but a flat top shape.

Figure 17D:
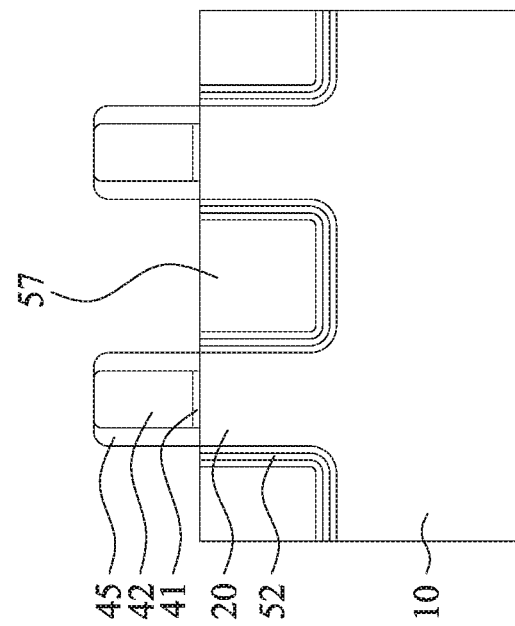
FIG. 17D shows one of the various stages of sequential processes for manufacturing a semiconductor device according to another embodiment of the present disclosure.
Figure 17C:
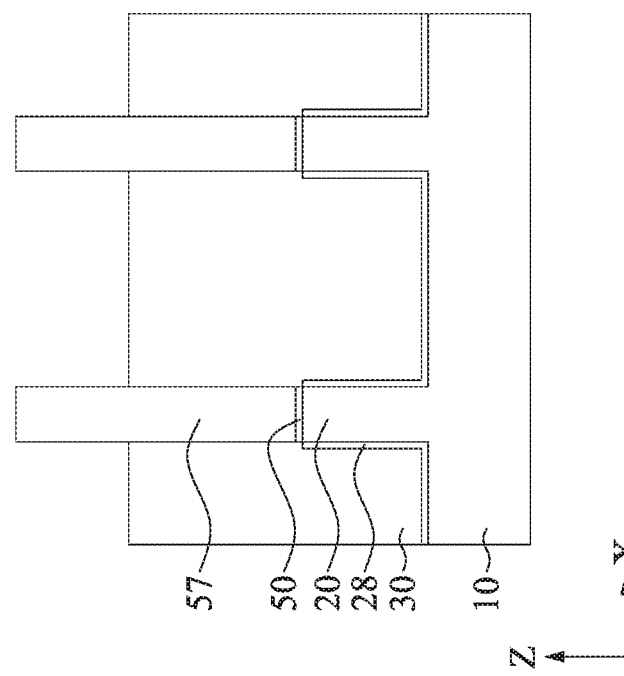

FIGS. 17A-17C show one of the various stages of sequential processes for manufacturing a semiconductor device having FinFETs with a barrier semiconductor layer in a source/drain structure according to an embodiment of the present disclosure. FIG. 17A is a cross sectional view corresponding to line X1-X1 of FIG. 17B and FIG. 17C is a cross sectional view corresponding to line Y1-Y1 of FIG. 17B.

After the barrier semiconductor layer 50 is formed, one or more source/drain epitaxial semiconductor layers 57 are formed over the barrier semiconductor layer 50 as shown in FIGS. 17A and 17B. In some embodiments, the source/drain epitaxial layer 57 has the same as or similar composition to the source/drain epitaxial layer 55 as set forth above.

The source/drain epitaxial layer 57 (e.g., Ge:P or SiGe:P) can be epitaxially formed on the barrier semiconductor layer 50 by using a metal-organic CVD (MOCVD), molecular beam epitaxy (MBE), ALD or any other film formation methods. In some embodiments, a $Ge_2H_6$ gas is used as a source gas of Ge. In some embodiments, a $Si_2H_6$ gas is used as a source gas of Si. In certain embodiments, instead of or, in addition to, $Ge_2H_6$ and/or $Si_2H_6$, $GeH_4$ and/or $SiH_4$ is used. One or more inert gas, such as $H_2$, He, Ar and/or $N_2$, is used as a dilution gas.

During the epitaxial formation of the Ge:P layer or the SiGe:P layer, a substrate temperature is maintained at a range from about 350° C. to about 410° C. in some embodiments. The substrate temperature is a temperature of a hot plate or a wafer holder/stage. In other embodiments, the substrate temperature is in a range from about 380° C. to about 400° C. When a $Ge_2H_6$ gas and/or a $Si_2H_6$ gas is used, it is possible to epitaxially form the Ge or SiGe layer 57 at a relatively low temperature of less than about 400° C. The source/drain epitaxial layer 57 can be selectively formed from the barrier semiconductor layer 50, and is not formed on the upper surface of the ILD layer 60. A doping gas is $PH_3$ for phosphorous, $AsH_3$ for arsenic or $B_2H_6$ for boron. In some embodiments, the source/drain epitaxial layer 57 as deposited has an uneven surface.

After the source/drain epitaxial layer 57 is formed, a thermal annealing operation is optionally performed to flatten the surface of the source/drain epitaxial layer 57, as shown in FIGS. 17A and 17B. The annealing operation is performed by heating the substrate at a temperature in a range from about 410° C. to about 470° C. in some embodiments, and in a range from about 440° C. to about 460° C. in other embodiments. The annealing operation is performed for a time duration in a range from about 100 sec to about 500 sec in some embodiments, and in a range from about 250 sec to 350 sec in other embodiments. In some embodiments, the annealing operation is performed in the same manufacturing apparatus, in particular, in the same process chamber as the process of forming the source/drain epitaxial layer 57. In certain embodiments, after the process gas(es) for the epitaxial growth is/are stopped, and then the substrate temperature is increased to the annealing temperature. Thus, the annealing operation is performed without exposing the substrate (the source/drain epitaxial layer) to the atmosphere, in particular to an oxygen containing atmosphere. In some embodiments, during the annealing operation, an inert gas, such as $H_2$, He, Ar and/or $N_2$, is supplied. By the annealing operation, the upper surface of the source/drain epitaxial layer 57 becomes substantially flat.

In certain embodiments, a laser annealing operation is performed to flatten the source/drain epitaxial layer 70. In such a case, a laser beam is selectively applied only to the source/drain area avoiding the gate structure. In some embodiments, the source/drain epitaxial layer is heated to about 800° C. to about 1000° C. in some embodiments. The time duration of applying the laser to the source/drain region is in a range from about 0.1 nsec to 1000 nsec in some embodiments, and is in a range from about 1 nsec to 100 nsec in other embodiments.

FIG. 17D shows a cross sectional view after the flattening operation when a three layer diffusion barrier layer 52 is formed.

FIGS. 18A and 18B show one of the various stages of sequential processes for manufacturing a semiconductor device having FinFETs with a barrier semiconductor layer in a source/drain structure according to another embodiment of the present disclosure. FIG. 18A is a cross sectional view corresponding to line Y1-Y1 of FIG. 18B.

Similar to FIGS. 18A and 18B, an ILD layer 60 is formed and is patterned by one or more lithography and etching operations, thereby forming a source/drain opening 61. In the source/drain opening 61, the source/drain epitaxial layer 57 formed over fin structure 20 is exposed.

Figure 19B:
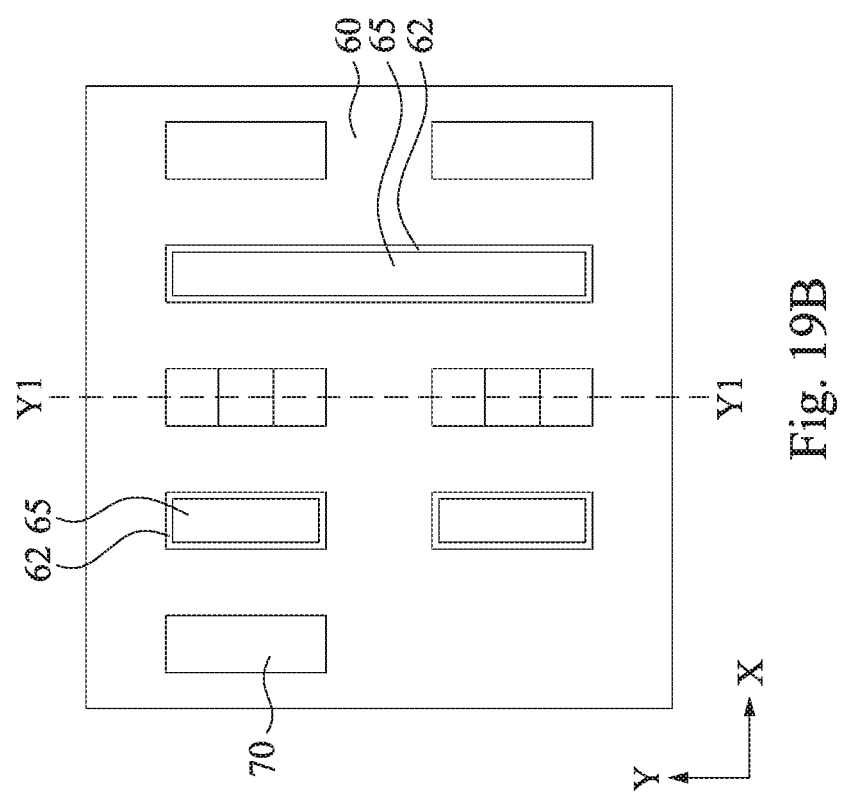
FIGS. 19A and 19B show one of the various stages of sequential processes for manufacturing a semiconductor device according to another embodiment of the present disclosure.
Figure 19A:
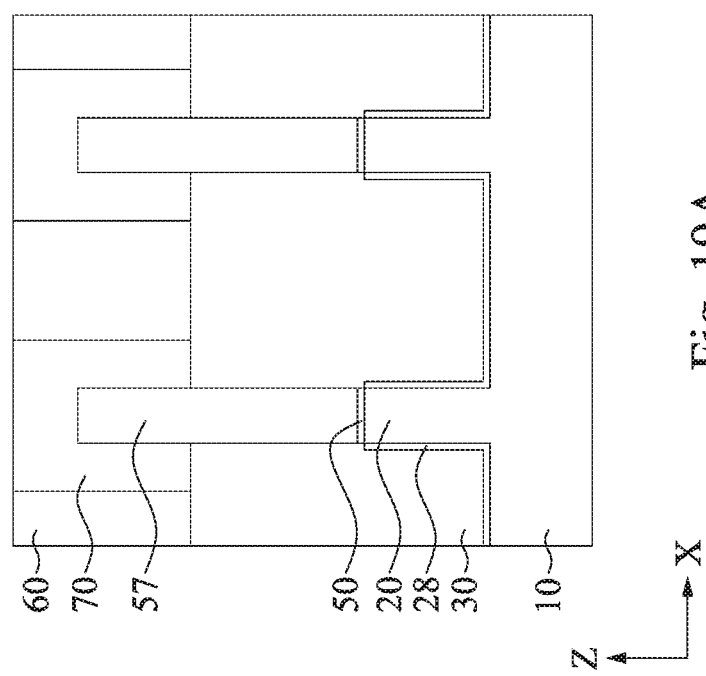

FIGS. 19A and 19B show one of the various stages of sequential processes for manufacturing a semiconductor device having FinFETs with a barrier semiconductor layer in a source/drain structure according to another embodiment of the present disclosure. FIG. 19A is a cross sectional view corresponding to line Y1-Y1 of FIG. 19B.

Similar to FIGS. 15A and 15B, after the source/drain opening 61 is formed, a conductive contact 70 is formed, as shown in FIGS. 19A and 19B.

In some embodiments, after the dummy gate structure 40 is formed and before the source/drain epitaxial layer 57 is formed, an ILD layer 60 is formed, and then the ILD layer 60 is patterned to make openings over the source/drain regions. Then, the source/drain epitaxial layer 57 having a flat top is formed. Subsequently, a second ILD layer is formed to protect the source/drain epitaxial layer 57, and the gate replacement process is performed.

FIG. 20 shows a cross sectional view of a semiconductor device having FinFETs with a barrier semiconductor layer in a source/drain structure according to another embodiment of the present disclosure. FIG. 20 is a cross sectional view along the gate extending direction.

In this embodiment, an additional source/drain epitaxial layer 59 is formed on a source/drain epitaxial layer 58, which is formed on the barrier semiconductor layer 50 or 52. The source/drain epitaxial layer 58 is has the same composition as the source/drain epitaxial layers 55 or 57. The additional source/drain epitaxial layer 59 is made of $Si_w Ge_{1-w}$, where $0.7 \leq w \leq 1.0$, in some embodiments. In certain embodiments, the additional source/drain epitaxial layer 59 is made of Si. In some embodiments, the additional source/drain epitaxial layer 59 is doped with P. The amount of P is in a range from about $1\times10^{19}$ atoms/cm$^3$ to $1\times10^{20}$ atoms/cm$^3$. In other embodiments, the amount of P is in a range from about $5\times10^{19}$ atoms/cm$^3$ to $8\times10^{19}$ atoms/cm$^3$.

FIGS. 21A-27B show sequential processes for manufacturing a semiconductor device having GAA FETs with a barrier semiconductor layer in a source/drain epitaxial structure according to an embodiment of the present disclosure. It is understood that additional operations can be provided before, during, and after processes shown by FIGS. 21A-27B, and some of the operations described below can be replaced or eliminated, for additional embodiments of the method. The order of the operations/processes may be interchangeable.

Figure 21B:
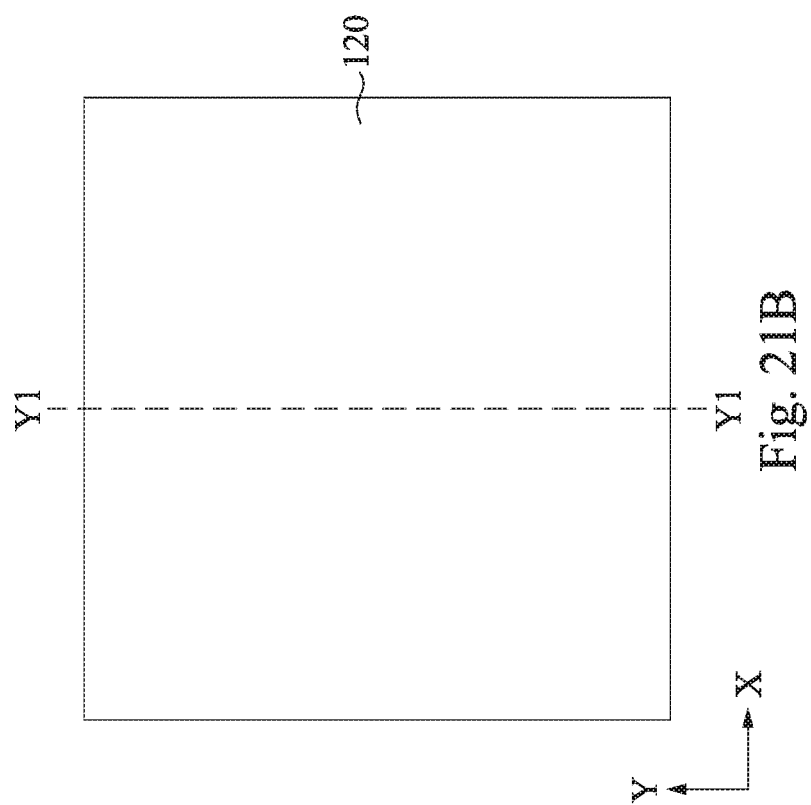
FIGS. 21A and 21B show one of the various stages of sequential processes for manufacturing a semiconductor device according to another embodiment of the present disclosure.
Figure 21A:
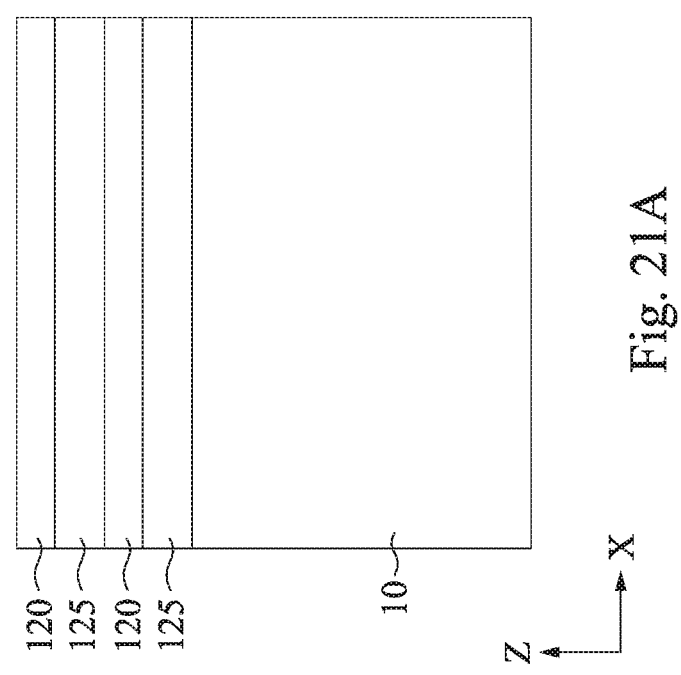

FIGS. 21A and 21B show one of the various stages of sequential processes for manufacturing a semiconductor device having GAAFETs with a barrier semiconductor layer in a source/drain structure according to another embodiment of the present disclosure. FIG. 21A is a cross sectional view corresponding to line Y1-Y1 of FIG. 21B.

As shown in FIG. 21A, first semiconductor layers 120 and second semiconductor layer 125 are alternately stacked over the substrate 10. In one embodiment, the substrate 10 is made of Ge or has a Ge layer at the surface of the substrate. In other embodiments, the substrate 10 is made of $Si_x Ge_{1-x}$, where $0<x\leq 0.3$ or has a $Si_x Ge_{1-x}$ layer at the surface of the substrate 10.

In some embodiments, the first semiconductor layers 120 are Ge or $Si_x Ge_{1-x}$, where $0<x\leq 0.3$, and the second semiconductor layer 125 are Si or $Si_v Ge_{1-v}$, where $0.5<v<1.0$. The first semiconductor layer 120 and the second semiconductor layer 125 are epitaxially formed by using CVD, MBE, ALD or any other suitable methods. In some embodiments, a buffer semiconductor layer is formed on the substrate 10.

Figure 22B:
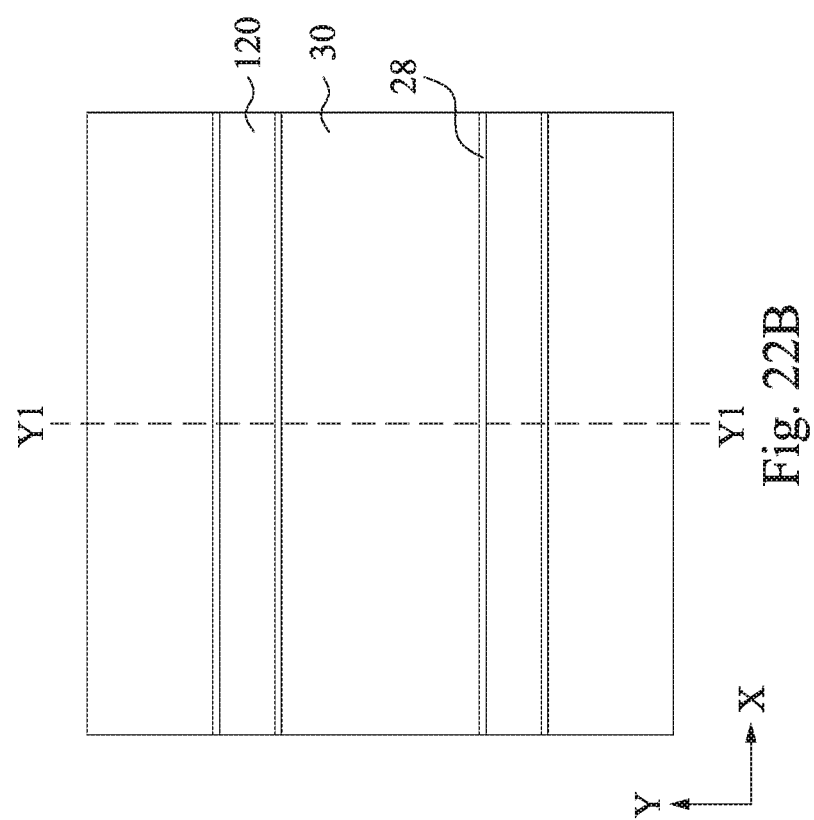
FIGS. 22A and 22B show one of the various stages of sequential processes for manufacturing a semiconductor device according to another embodiment of the present disclosure.
Figure 22A:
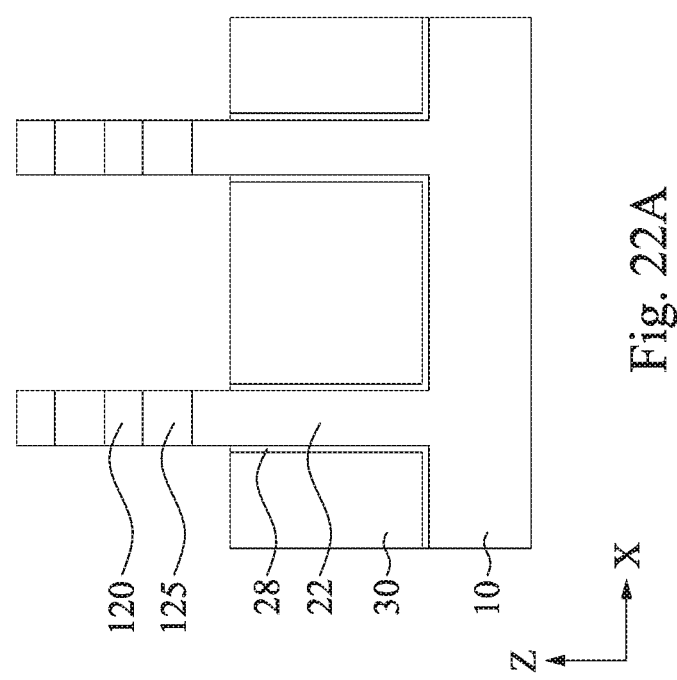

By using the similar operations explained with respect to FIGS. 2A-4B, fin structures protruding from the isolation insulating layer 30 are formed, as shown in FIGS. 22A and 22B. FIG. 22A is a cross sectional view corresponding to line Y1-Y1 of FIG. 22B.

As shown in FIG. 22A, the fin structures include multiple layers of the first semiconductor layers 120 and the second semiconductor layers 125 alternately stacked over a bottom fin structure 22. Although FIG. 22A shows two first semiconductor layers 120 and two second semiconductor layers 125, the number of the first and second semiconductor layer can be one, three or more than three and up to ten.

By using the similar operations explained with respect to FIGS. 5A-9C, a dummy gate structure 40 including a dummy gate dielectric layer 41 and a dummy gate electrode layer 42 is formed, and sidewall spacers 45 are formed. Then, source/drain regions of the fin structures are recessed and one or more barrier semiconductor layer 50 is formed on the inner surface of the recessed source/drain region, as shown in FIGS. 23A and 23B. FIG. 23A is a cross sectional view corresponding to line X1-X1 of FIG. 23B.

Figure 24B:
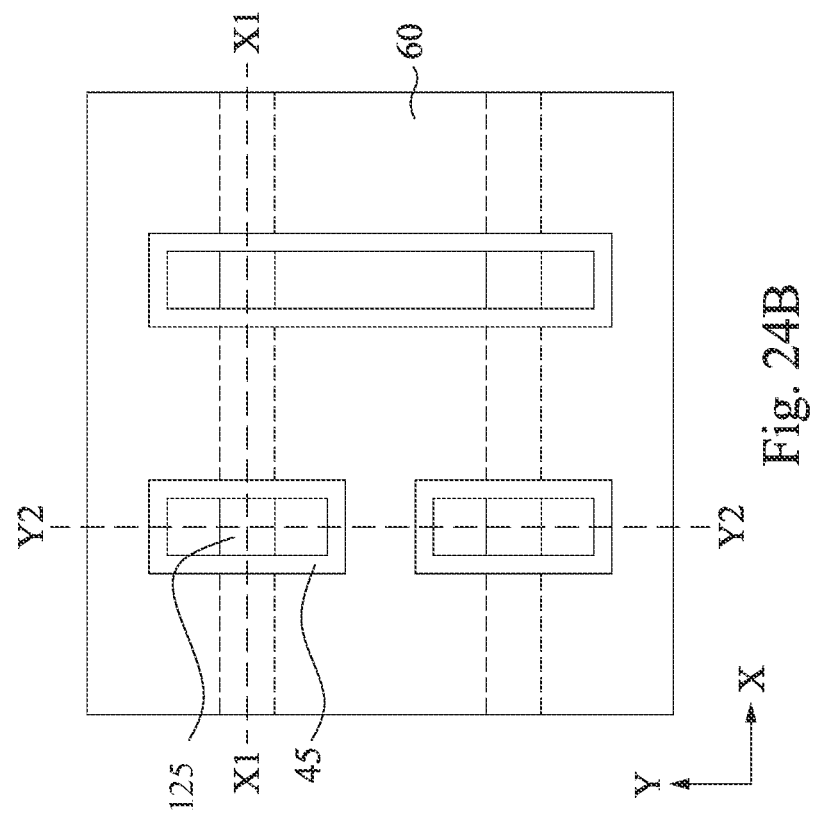
FIGS. 24A, 24B and 24C show one of the various stages of sequential processes for manufacturing a semiconductor device according to another embodiment of the present disclosure.
Figure 24A:
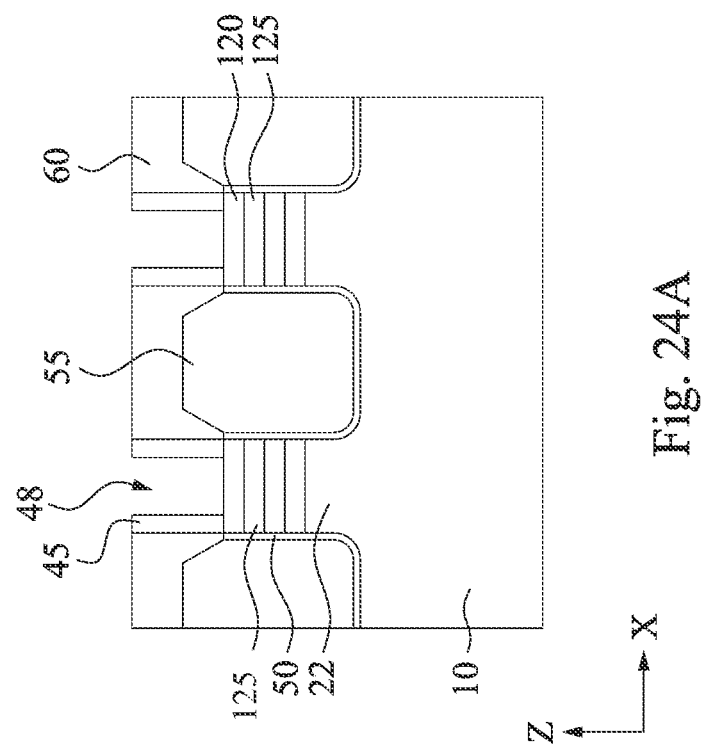
Figure 24C:
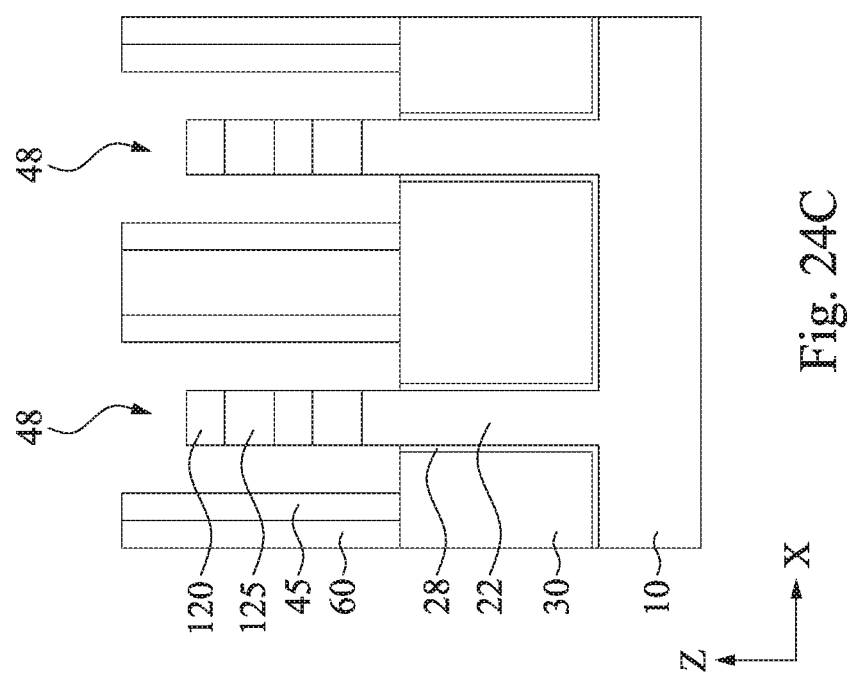

Then, similar to FIGS. 10A-12B, an ILD layer 60 is formed and gate opening 48 are formed, in which the upper portions of the fin structures 121 are exposed, respectively, as shown in FIGS. 24A-24C. FIG. 24A is a cross sectional view corresponding to line X1-X1 of FIG. 24B and FIG. 24C is a cross sectional view corresponding to line Y2-Y2 of FIG. 24B.

Figure 25B:
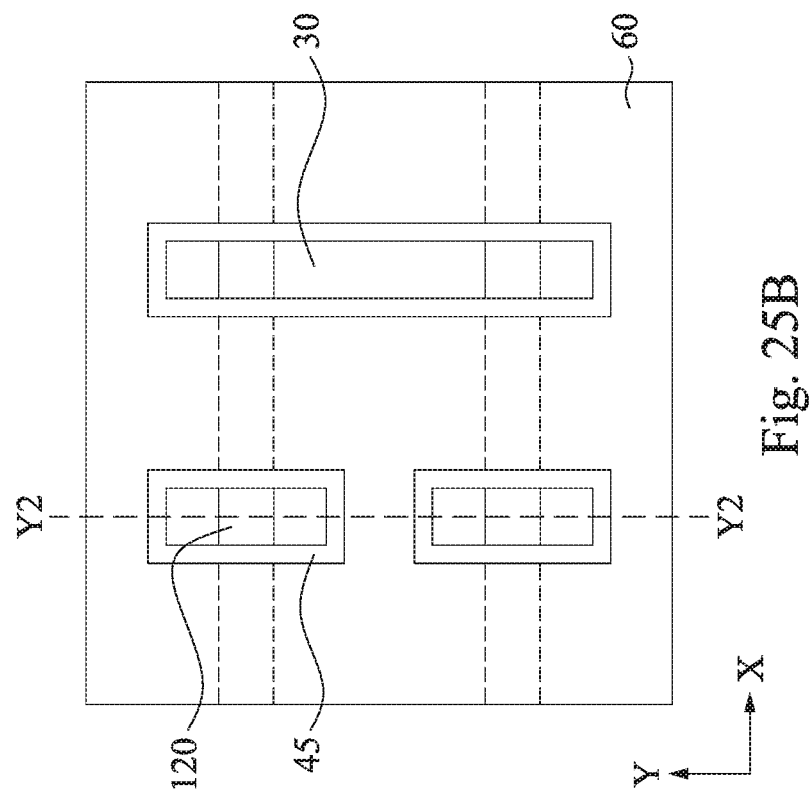
FIGS. 25A and 25B show one of the various stages of sequential processes for manufacturing a semiconductor device according to another embodiment of the present disclosure.
Figure 25A:
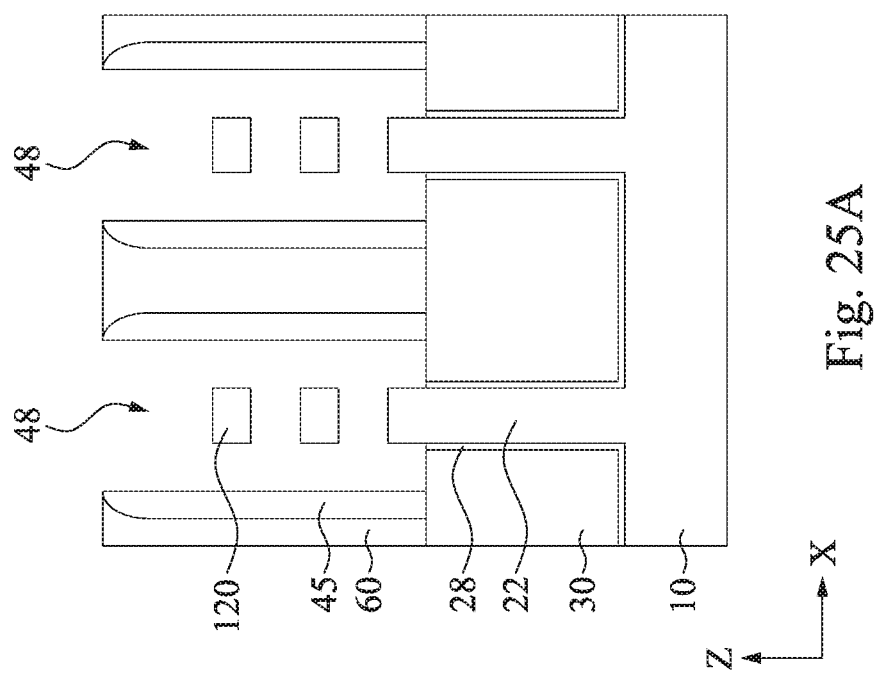

After the gate opening 48 are formed, the second semiconductor layers 125 are removed in the gate opening 48, as shown in FIGS. 25A and 25B. FIG. 25A is a cross sectional view corresponding to line Y2-Y2 of FIG. 25B. The second semiconductor layers 125 can be selectively removed using a wet etchant such as, but not limited to, ammonium hydroxide ($NH_4OH$), tetramethylammonium hydroxide (TMAH), ethylenediamine pyrocatechol (EDP), or potassium hydroxide (KOH) solution. Thus, semiconductor wires are formed of the first semiconductor layers 120.

Then, by using the similar operations explained with respect to FIGS. 13A and 13B, gate structures having a gate dielectric layer 62 and a gate electrode layer 65, wrapping around the semiconductor wires 120 are formed, as shown in FIGS. 26A and 26B. FIG. 26A is a cross sectional view corresponding to line Y2-Y2 of FIG. 26B.

Further, by using the similar operations explained with respect to FIGS. 14A-15B, a source/drain contact 70 is formed It is understood that the FinFETs and GAA FETs undergo further CMOS processes to form various features such as contacts/vias, interconnect metal layers, dielectric layers, passivation layers, etc.

The various embodiments or examples described herein offer several advantages over the existing art. For example, in the present disclosure, by using a diffusion barrier layer, which is a thin Si layer or a this Si rich layer having a higher Si amount than the source/drain region (fin structure) and/or the epitaxial layer formed thereon, it is possible to suppress impurity (e.g., P) diffusion from the epitaxial layer to the channel region of the fin structure. Thus, it is possible to obtain lower Ioff, higher carrier mobility, lower dielectric leakage and/or higher reliability in a FinFET or a GAAFET. The thin diffusion barrier layer can effectively suppress diffusion of other impurities such as As, Sb and/or B. In addition to FinFETs and GAAFETs, the source/drain structure having a diffusion barrier layer as set forth above can be applied to planar FETs or other FETs.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a gate structure is formed over a fin structure. A source/drain region of the fin structure is recessed. A first semiconductor layer is formed over the recessed source/drain region. A second semiconductor layer is formed over the first semiconductor layer. The fin structure is made of $Si_xGe_{1-x}$, where $0 \le x \le 0.3$, the first semiconductor layer is made of $Si_yGe_{1-y}$, where $0.45 \le y \le 1.0$, and the second semiconductor layer is made of $Si_zGe_{1-z}$, where $0 \le z \le 0.3$. In one or more of the foregoing or following embodiments, the fin structure is made of Ge, and the second semiconductor layer is made of Ge. In one or more of the foregoing or following embodiments, the first semiconductor layer is made of Si. In one or more of the foregoing or following embodiments, $0.5 \le y \le 1.0$. In one or more of the foregoing or following embodiments, a thickness of the first semiconductor layer is in a range from 0.2 nm to 0.8 nm. In one or more of the foregoing or following embodiments, the fin structure is made of undoped Ge. In one or more of the foregoing or following embodiments, the second semiconductor layer is made of Ge doped with phosphorous. In one or more of the foregoing or following embodiments, a concentration of phosphorous is in a range from $5 \times 10^{19}$ atoms/cm$^3$ to $1 \times 10^{20}$ atoms/cm$^3$. In one or more of the foregoing or following embodiments, the second semiconductor layer is made of Ge doped with boron. In one or more of the foregoing or following embodiments, further a third semiconductor layer is formed over the second semiconductor layer. In one or more of the foregoing or following embodiments, the third semiconductor layer is made of $Si_wGe_{1-w}$, where $0.7 \le w \le 1.0$.

In accordance with another aspect of the present disclosure, in a method of manufacturing a semiconductor device, a gate structure is formed over a fin structure. A source/drain region of the fin structure is recessed. A second barrier semiconductor layer is formed over the first barrier semiconductor layer. A third barrier semiconductor layer is formed over the second barrier semiconductor layer. A second semiconductor layer is formed over the third barrier semiconductor layer. A thickness of the first barrier semiconductor layer is in a range from 0.2 nm to 0.8 nm, a thickness of the second barrier semiconductor layer is in a range from 0.2 nm to 0.8 nm, and a thickness of the third barrier semiconductor layer is in a range from 0.2 nm to 0.8 nm. In one or more of the foregoing or following embodiments, the fin structure is made of $Si_xGe_{1-x}$, where $0 \le x \le 0.3$, the second semiconductor layer is made of $Si_zGe_{1-z}$, where $0 \le z \le 0.3$, and the first barrier semiconductor layer and the third barrier semiconductor layer are made of a different semiconductor material than the fin structure and the second semiconductor layer. In one or more of the foregoing or following embodiments, the first barrier semiconductor layer is made of $Si_{y1}Ge_{1-y1}$, where $0.2 \le y1 \le 0.7$, the second barrier semiconductor layer is made of $Si_{y2}Ge_{1-y2}$, where $0.5 \le y2 \le 1.0$, the third barrier semiconductor layer is made of $Si_{y3}Ge_{1-y3}$, where $0.2 \le y3 \le 0.7$, and $y1 > x$, $y2 > y1$, $y2 > y3$, and $y3 > z$. In one or more of the foregoing or following embodiments, the fin structure is made of Ge, and the second semiconductor layer is made of Ge. In one or more of the foregoing or following embodiments, the second barrier semiconductor layer is made of Si, and $0.4 \le y1$ and $y3 \le 0.6$. In one or more of the foregoing or following embodiments, the fin structure is made of undoped Ge. In one or more of the foregoing or following embodiments, the second semiconductor layer is made of Ge doped with phosphorous. In one or more of the foregoing or following embodiments, a concentration of phosphorous is in a range from $5 \times 10^{19}$ atoms/cm$^3$ to $1 \times 10^{20}$ atoms/cm$^3$.

In accordance with another aspect of the present disclosure, in a method of manufacturing a semiconductor device, a gate structure is formed over a fin structure. A source/drain region of the fin structure is recessed. An epitaxial semiconductor layer is formed over the barrier semiconductor layer. A thickness of the barrier semiconductor layer is in a range from 0.2 nm to 0.8 nm, and a diffusion coefficient of phosphorous at 450° C. of the barrier semiconductor layer is less than $1 \times 10^{-21}$ cm$^2$/s.

In accordance with one aspect of the present disclosure, a semiconductor device includes a gate structure disposed over a channel semiconductor layer, a source/drain region disposed on a side of the channel semiconductor layer, a first epitaxial semiconductor layer disposed over the source/drain region, a second epitaxial semiconductor layer disposed over the first epitaxial semiconductor layer, a conductive contact disposed over the second epitaxial semiconductor layer, and a dielectric layer having an opening filled by the conductive contact. In one or more of the foregoing or following embodiments, the semiconductor device further includes an isolation insulating layer on which the dielectric layer is disposed. The first epitaxial layer is disposed below an interface between the isolation insulating layer and the dielectric layer. In one or more of the foregoing or following embodiments, the channel semiconductor layer is made of $Si_xGe_{1-x}$, where $0 \le x \le 0.3$, the first epitaxial semiconductor layer is made of $Si_yGe_{1-y}$, where $0.45 \le y \le 1.0$, and the second epitaxial semiconductor layer is made of $Si_zGe_{1-z}$, where $0 \le z \le 0.3$. In one or more of the foregoing or following embodiments, the channel semiconductor layer and the source/drain region are made of Ge, and the second epitaxial semiconductor layer is made of Ge. In one or more of the foregoing or following embodiments, the first epitaxial semiconductor layer is made of Si. In one or more of the foregoing or following embodiments, $0.5 \le y \le 1.0$. In one or more of the foregoing or following embodiments, a thickness of the first epitaxial semiconductor layer is in a range from 0.2 nm to 0.8 nm. In one or more of the foregoing or following embodiments, an impurity concentration of the source/drain region is less than $1 \times 10^{18}$ atoms/cm$^3$. In one or more of the foregoing or following embodiments, the second epitaxial semiconductor layer is made of Ge doped with phosphorous. In one or more of the foregoing or following embodiments, a concentration of phosphorous is in a range from $5 \times 10^{19}$ atoms/cm$^3$ to $1 \times 10^{20}$ atoms/cm$^3$. In one or more of the foregoing or following embodiments, the second epitaxial semiconductor layer is made of Ge doped with boron.

In accordance with another aspect of the present disclosure, a semiconductor device includes a gate structure disposed over a channel semiconductor layer, a source/drain region disposed on a side of the channel semiconductor layer, a first barrier semiconductor layer disposed over the source/drain region, a second barrier semiconductor layer disposed over the first barrier semiconductor layer, a third barrier semiconductor layer disposed over the second barrier semiconductor layer, a second epitaxial semiconductor layer disposed over the third barrier semiconductor layer, a conductive contact disposed over the second epitaxial semiconductor layer, and a dielectric layer having an opening filled by the conductive contact. In one or more of the foregoing or following embodiments, a thickness of the first barrier semiconductor layer is in a range from 0.2 nm to 0.8 nm, a thickness of the second barrier semiconductor layer is in a range from 0.2 nm to 0.8 nm, and a thickness of the third barrier semiconductor layer is in a range from 0.2 nm to 0.8 nm. In one or more of the foregoing or following embodiments, the channel semiconductor layer is made of $Si_xGe_{1-x}$, where $0 \le x \le 0.3$, the second epitaxial semiconductor layer is made of $Si_zGe_{1-z}$, where $0 \le z \le 0.3$, and the first barrier semiconductor layer and the third barrier semiconductor layer are made of a different semiconductor material than the fin structure and the second semiconductor layer. In one or more of the foregoing or following embodiments, the first barrier semiconductor layer is made of $Si_{y1}Ge_{1-y1}$, where $0.2 \le y1 \le 0.7$, the second barrier semiconductor layer is made of $Si_{y2}Ge_{1-y2}$, where $0.45 \le y2 \le 1.0$, the third barrier semiconductor layer is made of $Si_{y3}Ge_{1-y3}$, where $0.2 \le y3 \le 0.7$, and $y1 > x$, $y2 > y1$, $y2 > y3$, and $y3 > z$. In one or more of the foregoing or following embodiments, the channel semiconductor layer is made of Ge, and the second epitaxial semiconductor layer is made of Ge. In one or more of the foregoing or following embodiments, the second barrier semiconductor layer is made of Si, and $0.4 \le y1$ and $y3 \le 0.6$. In one or more of the foregoing or following embodiments, the channel semiconductor layer is made of undoped Ge. In one or more of the foregoing or following embodiments, the second epitaxial semiconductor layer is made of Ge doped with phosphorous.

In accordance with another aspect of the present disclosure, a semiconductor device includes a gate structure disposed over a channel semiconductor layer, a source/drain region disposed on a side of the channel semiconductor layer, a first epitaxial semiconductor layer disposed over the source/drain region, a second epitaxial semiconductor layer disposed over the first epitaxial semiconductor layer, a conductive contact disposed over the second epitaxial semiconductor layer, and a dielectric layer having an opening filled by the conductive contact. A thickness of the first epitaxial semiconductor layer is in a range from 0.2 nm to 0.8 nm, and a diffusion coefficient of phosphorous at 450° C. of the first epitaxial semiconductor layer is less than $1 \times 10^{-21}$ cm$^2$/s.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   forming a fin structure;
   forming an isolation insulating layer so that an upper portion of the fin structure protrudes from the isolation insulating layer;
   forming a gate structure over a channel region of the fin structure;
   recessing a source/drain region of the fin structure, thereby forming a recess and exposing a side face of the channel region;
   after the source/drain region is recessed, forming a first barrier semiconductor layer on a bottom of the recess and a side wall of the recess including the side face of the channel region; and
   forming a second semiconductor layer over the first barrier semiconductor layer, wherein:
   a lower portion of the second semiconductor layer is embedded in the isolation insulating layer and in direct contact with the isolation insulating layer, and an upper portion of the second semiconductor layer protrudes from the isolation insulating layer,
   the fin structure is made of $Si_xGe_{1-x}$, where $0 \le x \le 0.3$,
   the first barrier semiconductor layer is made of Si, and has a thickness in a range from 0.2 nm to 0.8 nm, and
   the second semiconductor layer is made of $Si_zGe_{1-z}$, where $0 \le z \le 0.3$.

2. The method of claim 1, further comprising forming a second barrier semiconductor layer between the first barrier semiconductor layer and the second semiconductor layer, wherein the second barrier semiconductor layer is made of SiGe.

3. The method of claim 2, further comprising forming a third barrier semiconductor layer having a different composition than the second barrier semiconductor layer between the first barrier layer and the fin structure.

4. The method of claim 3, wherein:
the second barrier semiconductor layer is made of $Si_{y1}Ge_{1-y1}$, where $0.2 \leq y1 \leq 0.7$, and
the third barrier semiconductor layer is made of $Si_{y3}Ge_{1-y3}$, where $0.2 \leq y3 \leq 0.7$.

5. The method of claim 2, wherein the second barrier semiconductor layer is made of $Si_{y1}Ge_{1-y1}$, where $0.2 \leq y1 \leq 0.7$.

6. The method of claim 1, wherein:
the second semiconductor layer is made of Ge doped with phosphorous, and
a concentration of phosphorous is in a range from $5 \times 10^{19}$ atoms/cm$^3$ to $1 \times 10^{20}$ atoms/cm$^3$.

7. The method of claim 1, wherein the second semiconductor layer is made of Ge doped with boron.

8. The method of claim 1, further comprising forming a third semiconductor layer over the second semiconductor layer.

9. The method of claim 8, further comprising forming a fourth semiconductor layer between the first semiconductor layer and the fin structure.

10. The method of claim 8, wherein the third semiconductor layer is made of $Si_wGe_{1-w}$, where $0.7 \leq w \leq 1.0$.

11. A method of manufacturing a semiconductor device, the method comprising:
forming a gate structure over a fin structure;
recessing a source/drain region of the fin structure;
forming a first barrier semiconductor layer over the source/drain region;
forming a second barrier semiconductor layer over the first barrier semiconductor layer;
forming a third barrier semiconductor layer over the second barrier semiconductor layer;
forming a source/drain epitaxial semiconductor layer over the third barrier semiconductor layer, wherein:
a thickness of the first barrier semiconductor layer is in a range from 0.2 nm to 0.8 nm,
a thickness of the second barrier semiconductor layer is in a range from 0.2 nm to 0.8 nm,
a thickness of the third barrier semiconductor layer is in a range from 0.2 nm to 0.8 nm,
the fin structure is made of $Si_xGe_{1-x}$, where $0 \leq x \leq 0.3$,
the source/drain epitaxial semiconductor layer is made of $Si_zGe_{1-z}$, where $0 \leq z \leq 0.3$,
the first barrier semiconductor layer is made of $Si_{y1}Ge_{1-y1}$, where $0.2 \leq y1 \leq 0.7$,
the second barrier semiconductor layer is made of $Si_{y2}Ge_{1-y2}$, where $0.45 \leq y2 \leq 1.0$,
the third barrier semiconductor layer is made of $Si_{y3}Ge_{1-y3}$, where $0.2 \leq y3 \leq 0.7$, and $y1 > x$, $y2 > y1$, $y2 > y3$, and $y3 > z$.

12. The method of claim 11, wherein the first barrier semiconductor layer and the third barrier semiconductor layer are made of a different semiconductor material than the fin structure and the source/drain epitaxial semiconductor layer.

13. The method of claim 11, wherein the fin structure is made of Ge, and the source/drain epitaxial semiconductor layer is made of Ge.

14. The method of claim 13, wherein the second barrier semiconductor layer is made of Si, and $0.4 \leq y1$ and $y3 \leq 0.6$.

15. The method of claim 11, wherein the fin structure is made of undoped Ge.

16. The method of claim 11, wherein the source/drain epitaxial semiconductor layer is made of Ge doped with phosphorous.

17. The method of claim 16, wherein a concentration of phosphorous is in a range from $5 \times 10^{19}$ atoms/cm$^3$ to $1 \times 10^{20}$ atoms/cm$^3$.

18. A method of manufacturing a semiconductor device, the method comprising:
forming a fin structure extending in a first direction;
forming an isolation insulating layer so that an upper portion of the fin structure protrudes from the isolation insulating layer;
forming a gate structure over a channel region of the fin structure, the gate structure extending in a second direction crossing the first direction;
recessing a source/drain region of the fin structure to form a recess;
forming a barrier semiconductor layer in the recess, and
forming an epitaxial semiconductor layer over the barrier semiconductor layer, wherein:
in a cross section along the first direction, the epitaxial semiconductor layer is separated from the fin structure by the barrier semiconductor layer, and in a cross section along the second direction, the epitaxial semiconductor layer is in direct contact with the isolation insulating layer,
the barrier semiconductor layer includes a first layer, a second layer and a third layer, a composition of the second layer is different from a composition of the first layer and a composition of the third layer,
the second layer is made of Si, and has a thickness in a range from 0.2 nm to 0.8 nm, and
a diffusion coefficient of phosphorous at 450° C. of the barrier semiconductor layer is less than $1 \times 10^{-21}$ cm$^2$/s.

19. The method of claim 18, wherein:
the fin structure is made of $Si_xGe_{1-x}$, where $0 \leq x \leq 0.3$, and
the epitaxial semiconductor layer is made of $Si_zGe_{1-z}$, where $0 \leq z \leq 0.3$.

20. The method of claim 18, wherein a thickness of the second layer is smaller than a thickness of the first layer and a thickness of the third layer.

* * * * *